(12) United States Patent
Wiggins

(10) Patent No.: US 8,674,695 B2
(45) Date of Patent: Mar. 18, 2014

(54) RADIO FREQUENCY COIL ARRANGEMENT FOR HIGH FIELD MAGNETIC RESONANCE IMAGING WITH OPTIMIZED TRANSMIT AND RECEIVE EFFICIENCY FOR A SPECIFIED REGION OF INTEREST, AND RELATED SYSTEM AND METHOD

(75) Inventor: Graham Charles Wiggins, New York, NY (US)

(73) Assignee: New York University, New York, NY (US)

( * ) Notice: Subject to any disclaimer, the term of this patent is extended or adjusted under 35 U.S.C. 154(b) by 773 days.

(21) Appl. No.: 12/752,921

(22) Filed: Apr. 1, 2010

(65) Prior Publication Data

US 2010/0253348 A1    Oct. 7, 2010

Related U.S. Application Data

(60) Provisional application No. 61/165,822, filed on Apr. 1, 2009.

(51) Int. Cl.
   *G01V 3/00*   (2006.01)
   *A61B 5/05*   (2006.01)
   *G01R 33/48*  (2006.01)

(52) U.S. Cl.
   USPC ............ 324/318; 324/309; 324/322; 600/410

(58) Field of Classification Search
   USPC .......................... 324/300–322; 600/406–464
   See application file for complete search history.

(56) References Cited

U.S. PATENT DOCUMENTS

| | | | | |
|---|---|---|---|---|
| 5,185,577 A * | 2/1993 | Minemura | ............ | 324/318 |
| 5,394,087 A * | 2/1995 | Molyneaux | ............ | 324/318 |
| 5,500,594 A * | 3/1996 | Leussler | ............ | 324/318 |
| 5,519,321 A * | 5/1996 | Hagen et al. | ............ | 324/318 |
| 6,728,570 B2 * | 4/2004 | Kim | ............ | 600/422 |
| 6,946,840 B1 * | 9/2005 | Zou et al. | ............ | 324/318 |
| 7,663,367 B2 * | 2/2010 | Wiggins | ............ | 324/318 |
| 2011/0115483 A1 * | 5/2011 | Zhai et al. | ............ | 324/307 |
| 2012/0074935 A1 * | 3/2012 | Crozier et al. | ............ | 324/307 |

OTHER PUBLICATIONS

Hinton-Yates et al. "3.0 T Plaque Imaging," Top Magn. Reson. Imaging, 18:5; 389-400 (Oct. 2007).
Kraff et al. "An Eight-Channel Phased Array RF Coil for Spine MR Imaging at 7 T," Invest, Radio, 44, 11, 734-740 (2009).

* cited by examiner

Primary Examiner — Jermele M Hollington
Assistant Examiner — Emily Chan
(74) Attorney, Agent, or Firm — Andrews Kurth LLP

(57) ABSTRACT

For example, the present disclosure provides exemplary embodiments of a coil arrangement that can include, e.g., a plurality of elements which can be provided at an angle from one another. The angle can be selected to effectuate an imaging of a target region of interest at least one of a predetermined depth or range of depths, for example. In certain exemplary embodiments according to the present disclosure, the angle can be selected to effectuate an exemplary predetermined transmit efficiency for at least one of the elements. Additionally, the exemplary angle can be selected to effectuate a predetermined receive sensitivity for at least one of the elements. Further, according to certain exemplary embodiments of a coil arrangement in according to the present disclosure, the angle can be adjusted manually and/or automatically.

28 Claims, 20 Drawing Sheets

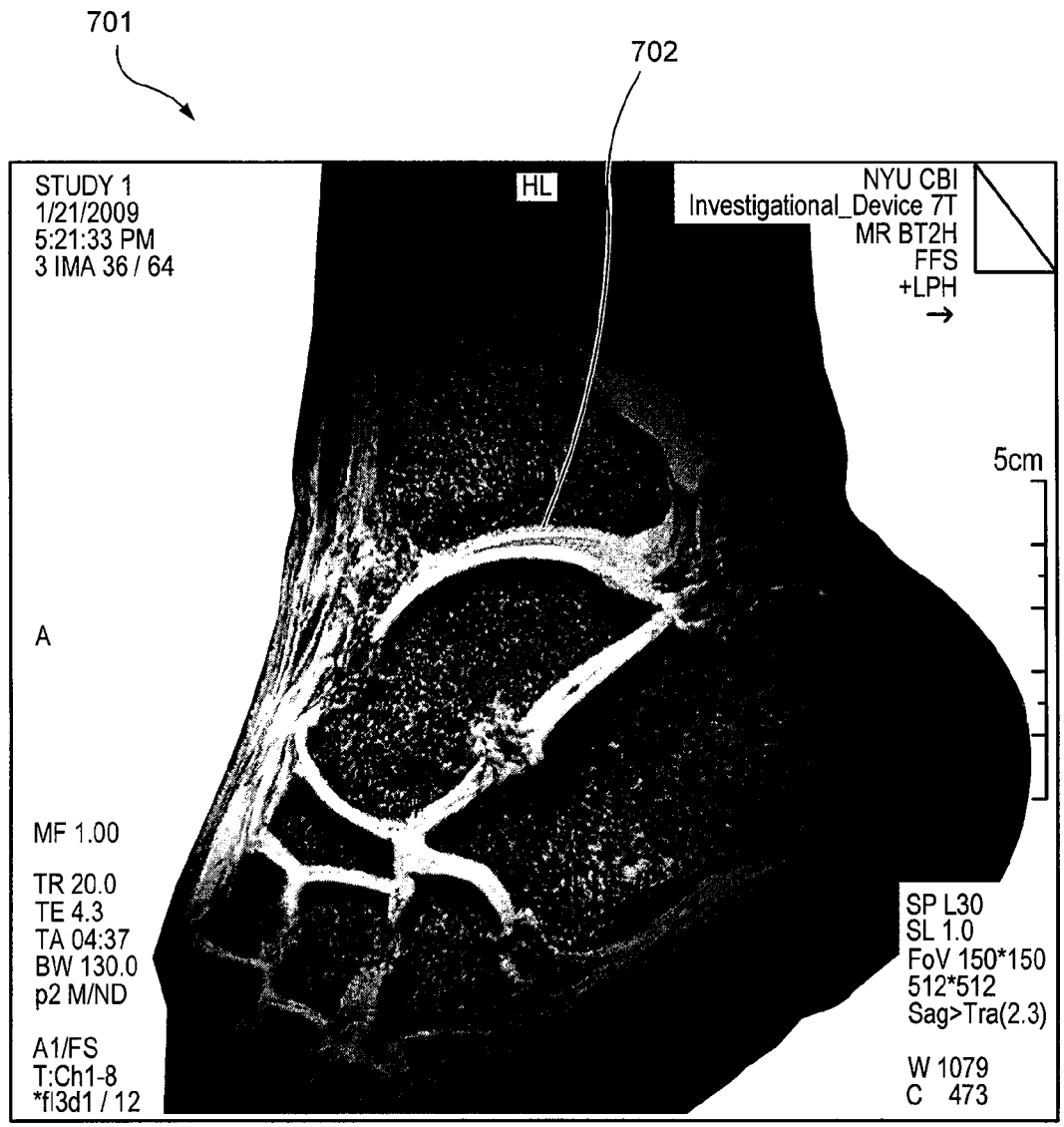
F I G. 7

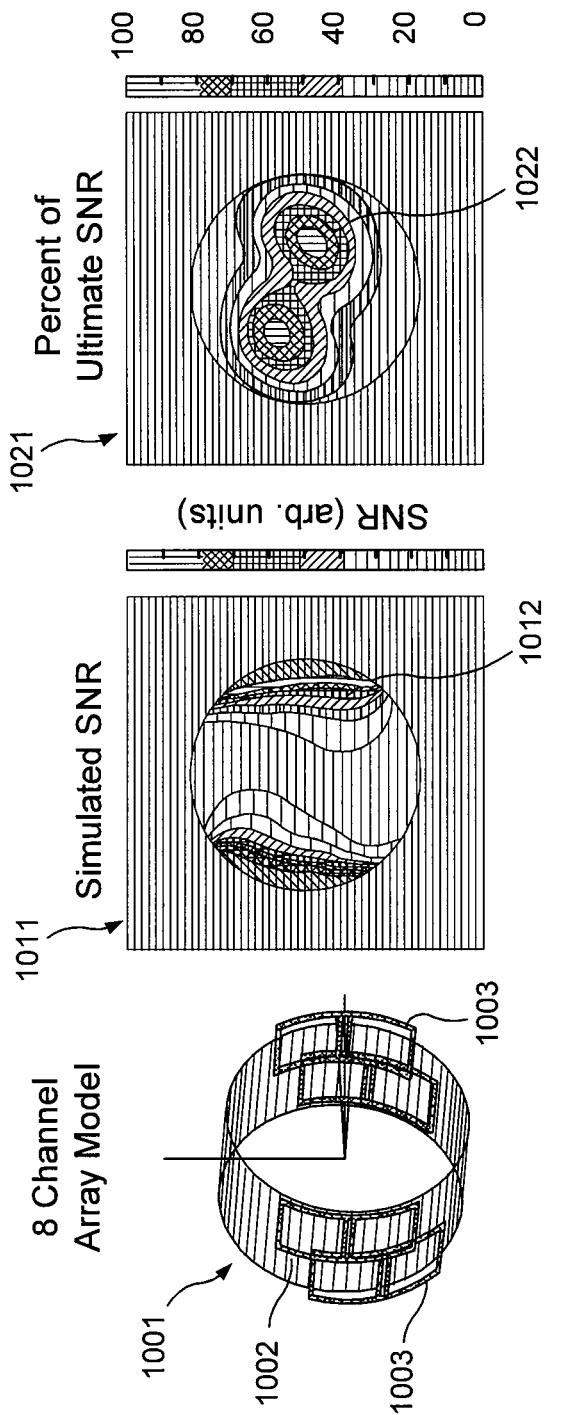

RADIO FREQUENCY COIL ARRANGEMENT FOR HIGH FIELD MAGNETIC RESONANCE IMAGING WITH OPTIMIZED TRANSMIT AND RECEIVE EFFICIENCY FOR A SPECIFIED REGION OF INTEREST, AND RELATED SYSTEM AND METHOD

CROSS-REFERENCE TO RELATED APPLICATION(S)

The present application relates to and claims priority from U.S. Patent Application No. 61/165,822 filed Apr. 1, 2009, the entire disclosure of which is hereby incorporated herein by reference.

FIELD OF THE DISCLOSURE

The present disclosure relates generally to exemplary embodiments of systems, apparatus and methods related to magnetic resonance imaging, and more particularly to a radio frequency (RF) coil arrangement for a high field magnetic resonance imaging (MRI) with optimized transmit and receive efficiency for a specified region of interest using, e.g., relative offset of transmit and receive elements, for example.

BACKGROUND INFORMATION

A significant challenge for magnetic resonance (MR) imaging at fields above 3 Tesla can be the relative lack of available radio frequency (RF) coils. In addition, the design of RF coils for high field can be complicated since, at the higher RF frequencies, there may be a more complex interaction of the RF excitation field with the sample. This can lead to an excitation inhomogeneity due to wavelength effects and complex twisted B1+ and B1− profiles which differ significantly from those seen at low field. Predicting the B1+ and B1− profiles which differ significantly from those seen at low field. Predicting the behavior of RF coil designs for high field MR can, at times, require a full wave simulation of the electromagnetic fields, since low-field quasi-static approximations no longer apply.

One simple RF coil design which can be employed for high field imaging is the transmit-receive surface coil. Even at low fields, this coil design suffers from transmit and receive profiles which are steeply reduced with depth into the sample. However, given the complexities of creating a uniform excitation in anything but the smallest volumes at high field, the transmit receive surface coil can provide an attractive solution for imaging small regions of interest in the body and for acquiring preliminary data as improved application-specific coils designs are developed. With increasing field, however, the efficiency of the transmit-receive surface coil can diminish due to the B1+ and B1− profiles being twisted in opposite directions.

Improvements in SNR can be obtained through the use of receive arrays optimized to particular regions of interest in the body. At 3 Tesla, improvements in carotid imaging can achieved by using a dedicated 8-channel carotid receive array. (See Hinton-Yates et al., Top Magn. Reson. Imaging 2007, 18:5; 389-400). At higher fields, transmit body coils may not be readily available, and uniform excitation in the body can be difficult to achieve. Therefore, any 7 Tesla coil should include a transmit capability, which can likely increase the complexity of the design thereof. In addition, the complex twisted B1+ and B1− profiles in human tissue at high RF frequencies can likely require a full wave electromagnetic simulation to accurately predict the performance of any given coil design, which provides additional complexity.

Thus, it may be beneficial to address and/or overcome at least some of the deficiencies described herein above.

SUMMARY OF EXEMPLARY EMBODIMENTS OF THE DISCLOSURE

Indeed, one of the objects of certain exemplary embodiments of the present disclosure can be to address the exemplary problems described herein above, and/or to overcome the exemplary deficiencies commonly associated with the prior art as, e.g., described herein.

For example, exemplary embodiments of a coil arrangement according to the present disclosure can include, e.g., a plurality of elements which can be provided at an angle from one another. The angle can be selected to effectuate an imaging of a target region of interest at least one of a predetermined depth or range of depths, for example.

In certain exemplary embodiments according to the present disclosure, the angle can be selected to effectuate an exemplary predetermined transmit efficiency for at least one of the elements. Additionally, the exemplary angle can be selected to effectuate a predetermined receive sensitivity for at least one of the elements. Further, according to exemplary embodiments of the coil arrangement in according to the present disclosure, the angle can be adjusted manually and/or automatically. The elements can be configured with respect to one another to create a gap in between each of the elements. Further, the elements can each comprise a substrate, which can be curved. At least one of the substrates can be provided so as to be positioned substantially above another one of the substrates.

According to certain exemplary embodiments, the coil arrangement can further comprise an array of surface coil receivers provided on at least one of the substrates. An exemplary array of surface coil receivers can be provided on the substrate closest to the material being imaged, and can be shifted relative to the center the coil structure. Additionally, an exemplary array of surface coil loops can be provided on at least another one of the substrates on at least another one of the substrates, and be configured to transmit a magnetic resonance signal. An exemplary array of surface coil loops can include a plurality of loops, and at least two of the loops can overlap one another. Further, the surface coil loops can be shifted relative to the center the coil structure. In additional exemplary embodiments according to the present disclosure, the surface coil loops can shifted relative to the center of the coil structure in an opposing direction from a direction which the surface coil receivers is shifted. For example, the surface coil receivers can be shifted relative to the center of the coil structure by a distance of between 30 mm and 40 mm, such as approximately 37 mm.

In further exemplary embodiments according to the present disclosure, an exemplary coil system can be provided that can include a plurality of coil arrangements. The coil arrangements can be configured to be substantially optimized with respect to a transmit profile and a receive profile to a specific region of interest of a body.

The position of the surface coil loops and/or the surface coil receivers can be shifted relative to the center of the coil arrangement so as to compensate for a twisting of a B1+ field and/or a B1− field, including a twisting of the B1+ field and the B1− field in opposing directions from one another. The coils can be configured for high field magnetic resonance imaging, wherein a high field can be a field of at least 3 Tesla.

Additionally, the angle can be selected to be, e.g., greater than zero degrees and less than or equal to about 60 degrees, and/or greater than or equal to about 10 degrees and less than or equal to about 50 degrees, such as about 30 degrees, for example. Further, certain exemplary coil arrangements according to the present disclosure can include at least one geometrically decoupled element so as to extend the coverage of imaging.

The elements can be configured to provide a phase between the elements so as to facilitate at least one of a quadrature or circularly polarized excitation in a region of interest and/or at least one of (i) compensate for the twisting of B1+ fields, or (ii) achieve a substantially maximum B1+ efficiency. Further, the phase can be capable of being controlled dynamically so as to adjust a depth of the region of interest in a sample. Further, the elements can be configured to provide for an overlap of two or more coils so as to substantially minimize an inductive coupling.

These and other objects, features and advantages of the present disclosure will become apparent upon reading the following detailed description of exemplary embodiments of the present disclosure, when taken in conjunction with the accompanying exemplary drawings and appended claims.

BRIEF DESCRIPTION OF THE DRAWINGS

The foregoing and other objects of the present disclosure will be apparent upon consideration of the following detailed description, taken in conjunction with the accompanying exemplary drawings and claims showing illustrative embodiments of the invention, in which:

FIG. 7 is an exemplary image of a human body part, obtained using procedures in accordance with certain exemplary embodiments of the present disclosure;

FIG. 10($a$) is an illustration of an exemplary representations of an exemplary embodiment of the coil arrangement/system in accordance with certain exemplary embodiments of the present disclosure;

FIG. 10($b$) is an illustration of an exemplary Signal-To-Noise (SNR) simulation that can correspond to the exemplary array of FIG. 10($a$), in accordance with certain exemplary embodiments of the present disclosure;

FIG. 10($c$) is an illustration of an exemplary ratio of the SNR percentages to an Ultimate SNR, in accordance with certain exemplary embodiments of the present disclosure;

FIG. 17($b$) is an illustration of an exemplary map that shows exemplary results for transmitting with a pair of surface coils where each data point can have already been optimized for a driving phase and an optimum position of this pair of coils relative to the chosen target region can be found, in accordance with certain exemplary embodiments of the present disclosure;

FIG. 17($c$) is an exemplary graph which shows a possible optimum driving phase for a configuration in accordance with certain exemplary embodiments of the present disclosure;

Figure 1:
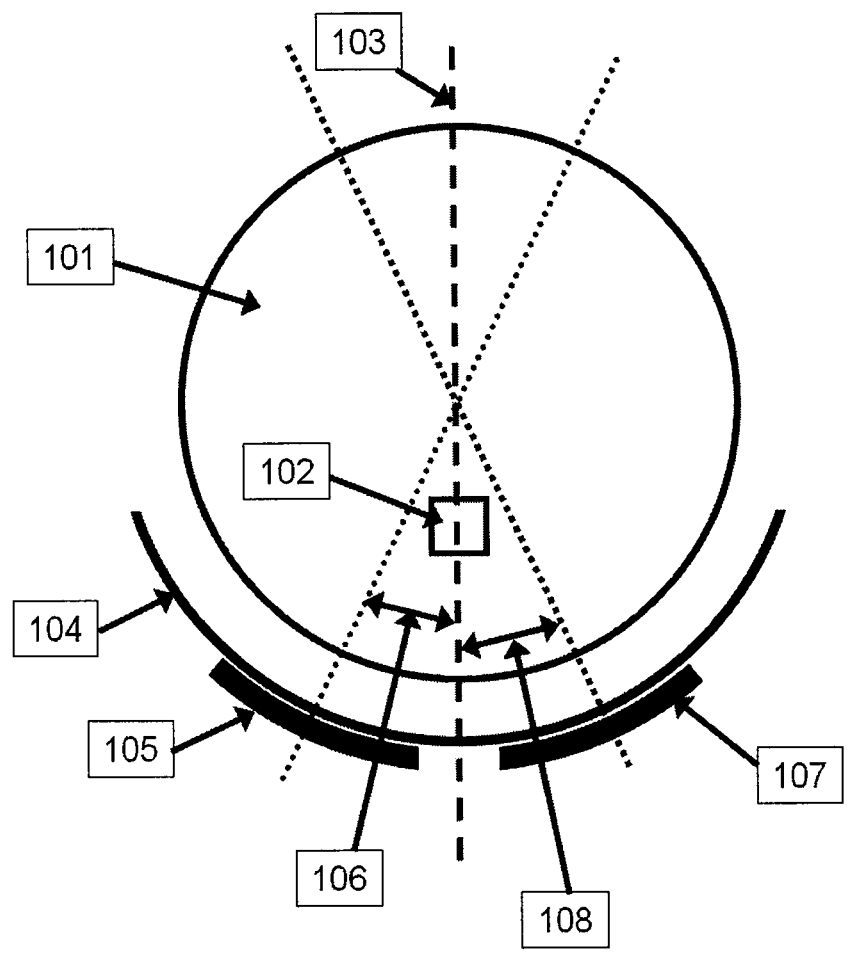
FIG. 1 is an illustration of an exemplary embodiment of a RF coil system/arrangement having a two surface coil loops, in accordance with the present disclosure.

Throughout the figures, the same reference numerals and characters, unless otherwise stated, are used to denote like features, elements, components or portions of the illustrated embodiments. Moreover, while the subject disclosure will now be described in detail with reference to the figures, it is done so in connection with the illustrative embodiments. It is intended that changes and modifications can be made to the described embodiments without departing from the true scope and spirit of the subject disclosure.

DETAILED DESCRIPTION OF EXEMPLARY EMBODIMENTS OF THE DISCLOSURE

In certain exemplary embodiments according to the present disclosure, it is possible to optimize both the transmit and receive profiles of a design of a coil arrangement and/or system by selecting a specific region of interest in the body. For example, according to exemplary embodiments of the present disclosure, it is possible to provide an 8-channel receive array for carotid imaging at 7 Tesla and used in human imaging.

Additionally, according to certain exemplary embodiments of the present disclosure, transmit and receive elements can be used which can be rotated relative to an imaging region of interest so as to optimize the transmit and receive profiles in that volume. SNR improvements of up to about 40% can be achieved at e.g., 7 Tesla.

FIG. 1 shows an illustration of an exemplary embodiment of a radio-frequency (RF) coil system/arrangement according to the present disclosure. For example, as shown in FIG. 1, with a volume of material or tissue to be imaged 101 and a Region of Interest (ROI) within the volume 102, a line 103 can be defined extending from the ROI to the surface of the volume 102. The exemplary embodiment of the RF coil system/arrangement can include, e.g., a substrate 104 on which a transmitter 105 can be mounted and offset from the line 103 by a specified and/or predetermined angle 106 or a particular distance along the substrate 104. According to certain exemplary embodiments of the present disclosure, this can be effectuated by taking into consideration that the efficiency of the transmitter 105 can be improved and/or maximized in the ROI of the volume 102. According to another exemplary embodiment of the present disclosure, a receiver 107 can be placed on the substrate 104 that is offset by an angle 108 or a particular distance along the substrate 104 such that the sensitivity of the receiver 107 is maximized in the ROI 102.

An exemplary material being imaged 101 is shown in FIG. 1, for the purposes of illustration, as a circle. However, it should be understood that numerous other shapes are within the scope of the exemplary embodiments of the present disclosure, and can correspond to, e.g., a part of a human body or an animal body. For example, the substrate 104 can be curved and/or flat, and can be conformed to follow, e.g., roughly or approximately, the contours of the material being imaged 101. The transmitter 105 can include any known device which can generate an RF excitation pulse at the magnetic resonance (MR) frequency in the material 101, and can comprise a surface coil loop, stripline antenna, solenoid and/or any other RF transmitter structure. The transmitter 105 can include a single transmitting structure and/or a multitude of transmitting structures acting together, such as, e.g., an array of surface coils and/or multiple stripline antennas. The exemplary dimensions of the transmitter 105 can be adjusted without reference to the dimensions of the receiver 107 so as to provide, e.g., the desired excitation profile in the material being imaged 101. The receiver 107 can include any known device using which an MR signal can be detected, including, but not limited to surface coil loops, stripline antennas and/or solenoids. For example, the receiver 107 can include a single receiving unit or a multitude of receiving units acting together, such as an array of surface coils and/or stripline antennas. The procedure of offsetting the transmit and receive elements can be applied, e.g., singly to optimize a transmit only coil and/or to optimize the sensitivity of a receiver on its own for a particular ROI.

Figure 2:
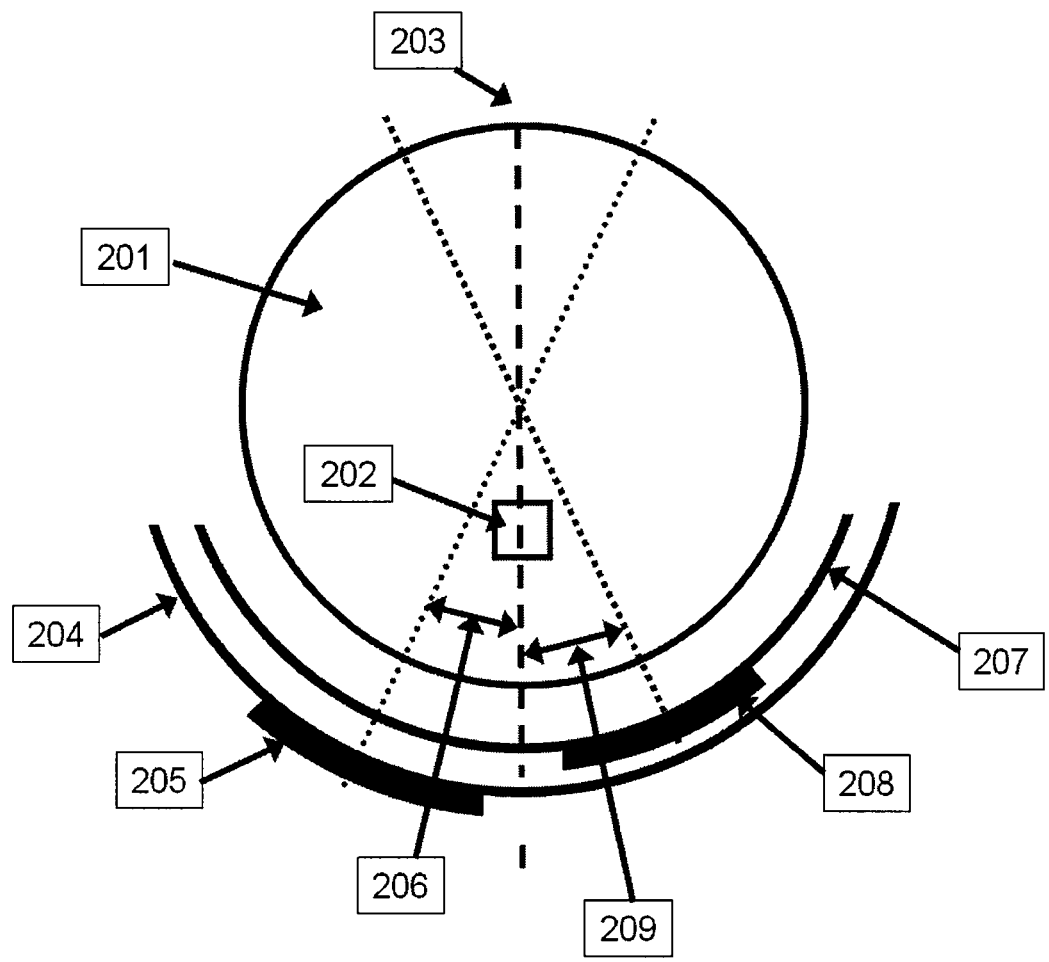
FIG. 2 is an illustration of one exemplary embodiment of two surface coil loops that can be mounted on separate substrates, which can slide over each other, in accordance with the present disclosure.
Figure 3:
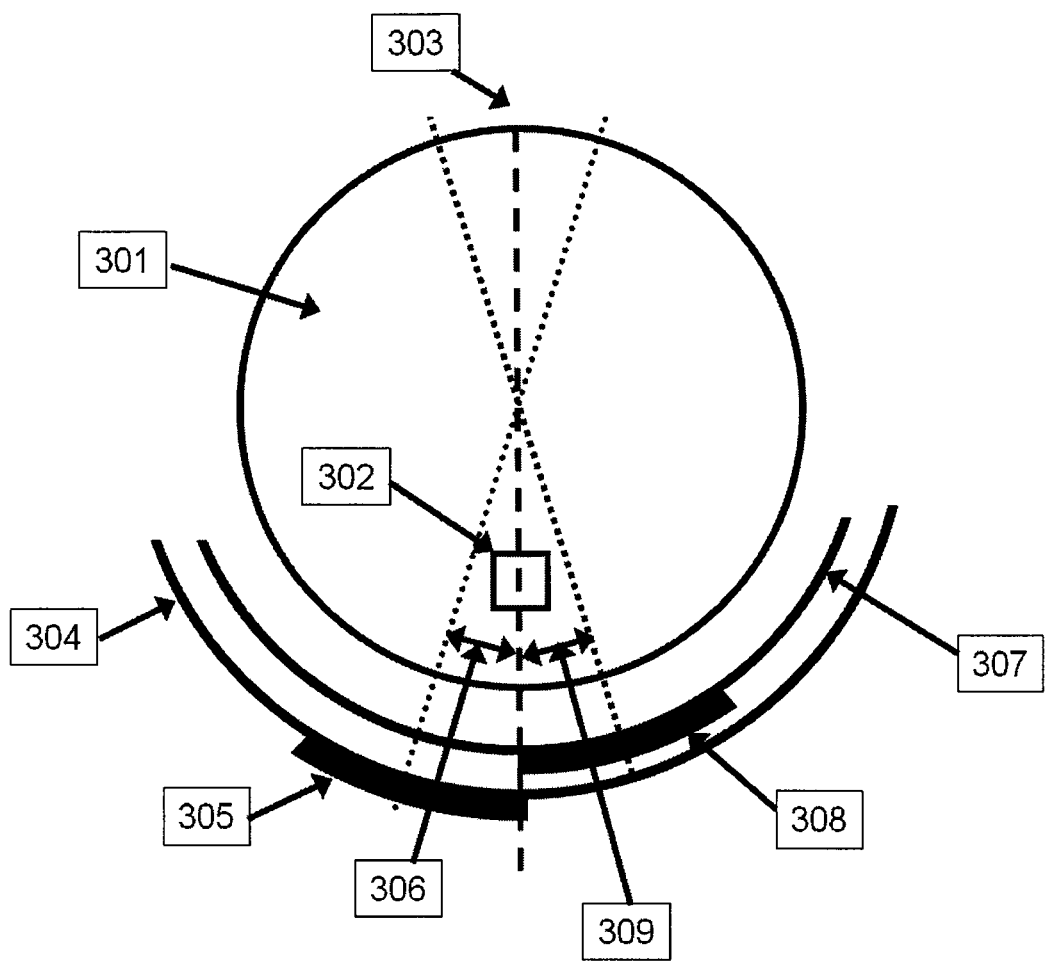
FIG. 3 is an illustration of another exemplary embodiment of the surface coil loops that can be mounted on separate substrates, and which can slide over each other, in accordance with the present disclosure.

FIGS. 2 and 3 show, e.g., two further exemplary embodiments of surface coil loops according to the present disclosure which can be mounted on separate substrates 204, 207 304, 307, which can slide over one other. In this example, one exemplary surface coil loop 205, 305 can be used to transmit the signals, and another exemplary surface coil 208, 308 can be used to receive the signals. By sliding the two surface coils 205, 208 and 305, 308, respectively, relative to each other, transmit efficiency and receive sensitivity can be optimized in a given ROI 202, 302 depending on the depth of the respective ROI 202,302 within the material 201, 301, respectively.

For example, for the ROI 202 deep within the volume of the material 201, the angle between the center line 203 and the surface coil centers can be large 206, 209, whereas for the ROI 302 near the surface of the material 301, the angle 306, 309 between the surface coil transmitter and receiver relative to the center line 303 can be decreased.

Figure 4:
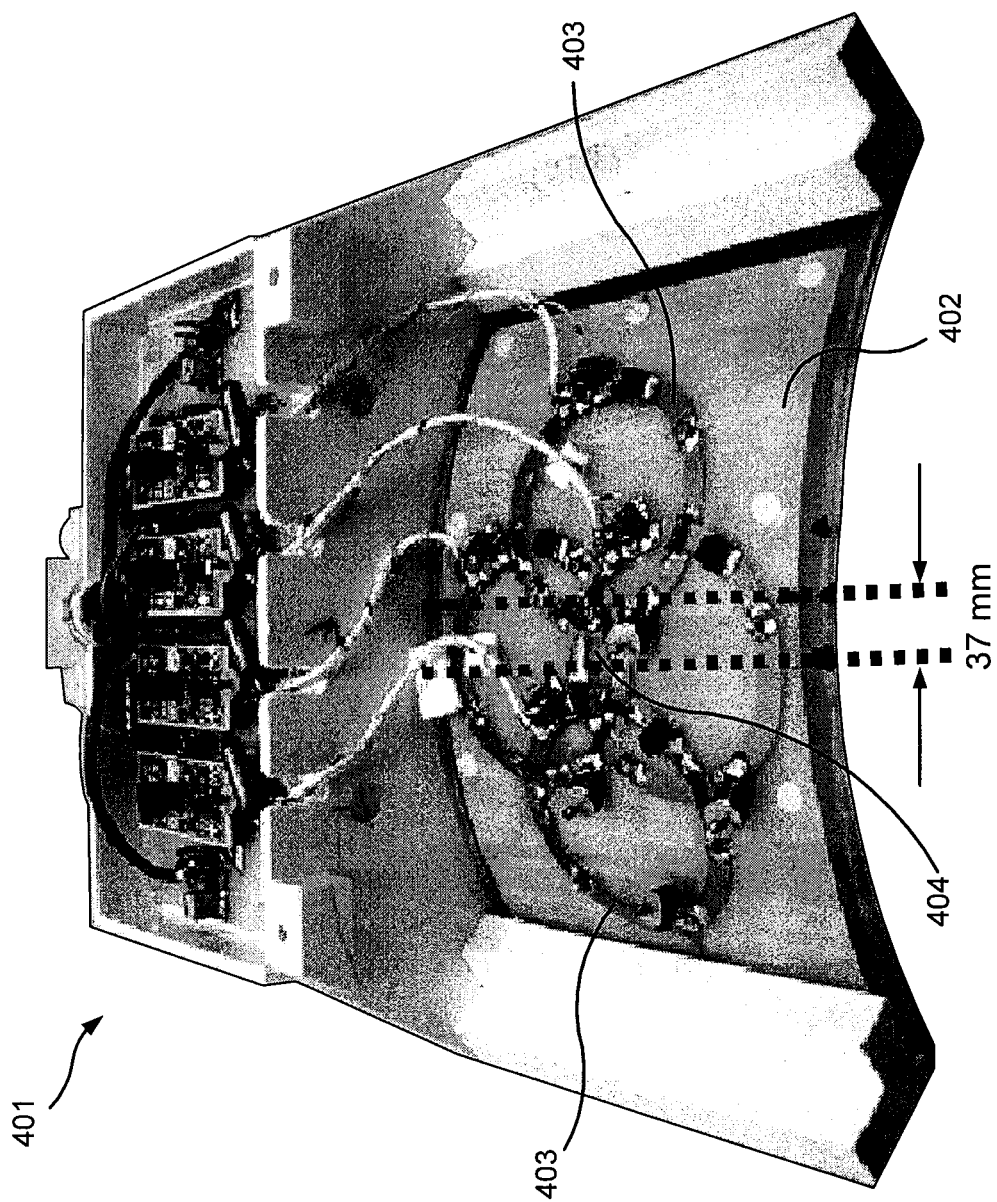
FIG. 4 is an illustration of another exemplary embodiment of a coil system/arrangement in accordance with the present disclosure.

FIG. 4 shows an illustration of another exemplary embodiment of the coil arrangement/system 401 according to the present disclosure.

Figure 5:
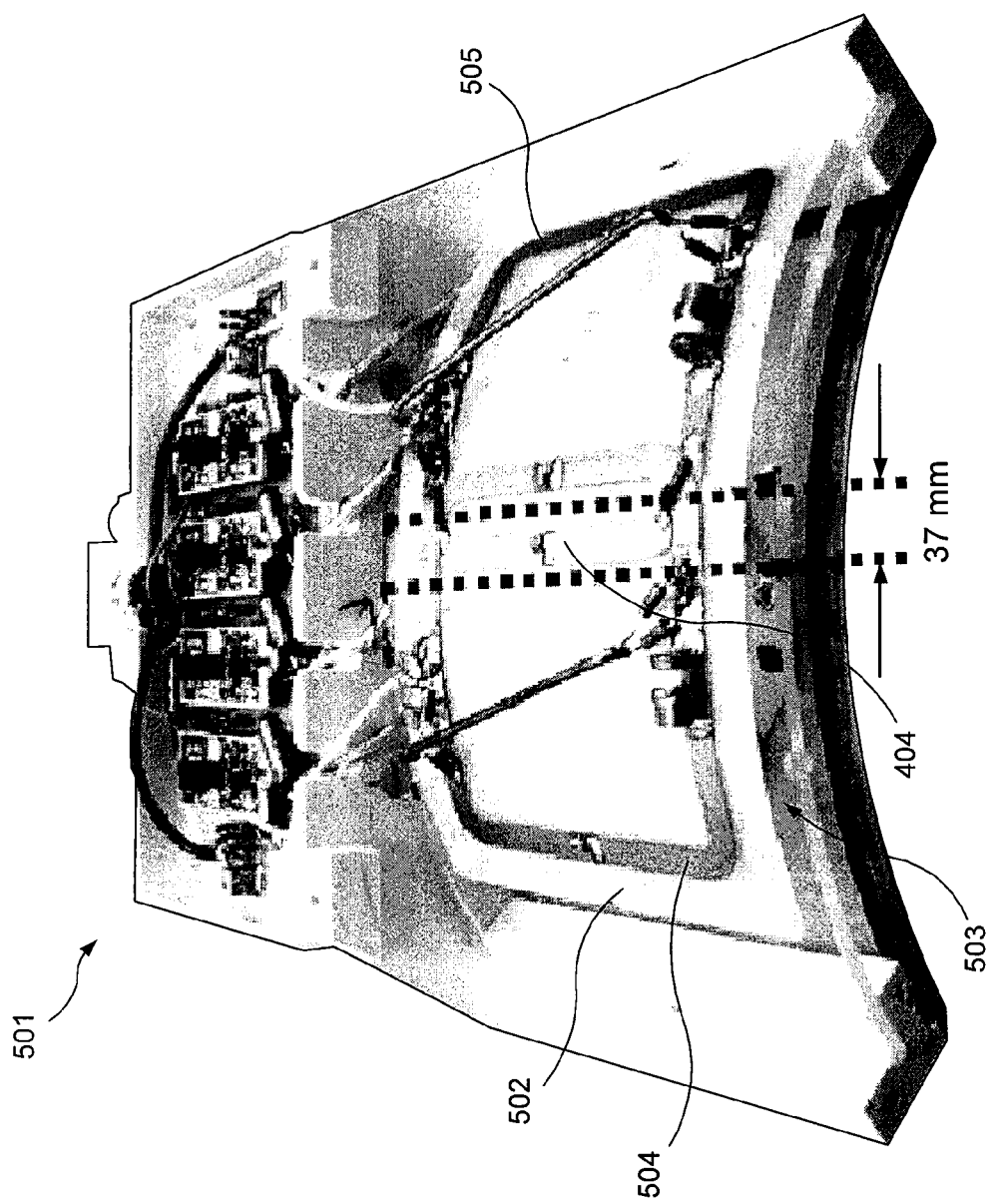
FIG. 5 is illustration of still another exemplary embodiment of the coil system/arrangement in accordance with certain exemplary embodiments of the present disclosure.

FIG. 5 shows another illustration of still exemplary embodiment of the coil arrangement/system 501 according to the present disclosure, which can be same as or similar to the exemplary coil arrangement/system 401 of FIG. 4.

As shown in the exemplary embodiments of FIGS. 4 and 5, e.g., two curved substrates 402, 502 can be provided with a gap 503 therebetween. An array of surface coil receivers 403 can be provided on the substrate 402, 502 closest to the material being imaged, with its position shifted by, e.g., approximately 37 mm relative to a center 404 of the coil arrangement/system 401, as shown in FIG. 4, for example.

A separate curved substrate 502 can be mounted above the first substrate, on which two overlapped surface coil loops 504, 505 (which can be used for transmitting an MRI signal) can be mounted. Such curved substrate 502 can be shifted at a particular distance (e.g., approximately 37 mm) away from the center 404 of the coil arrangement/system 501, in the opposite direction to the shift applied to the receive substrate 402 with the surface coil receive elements 403, as shown in FIG. 5, for example.

Figure 6:
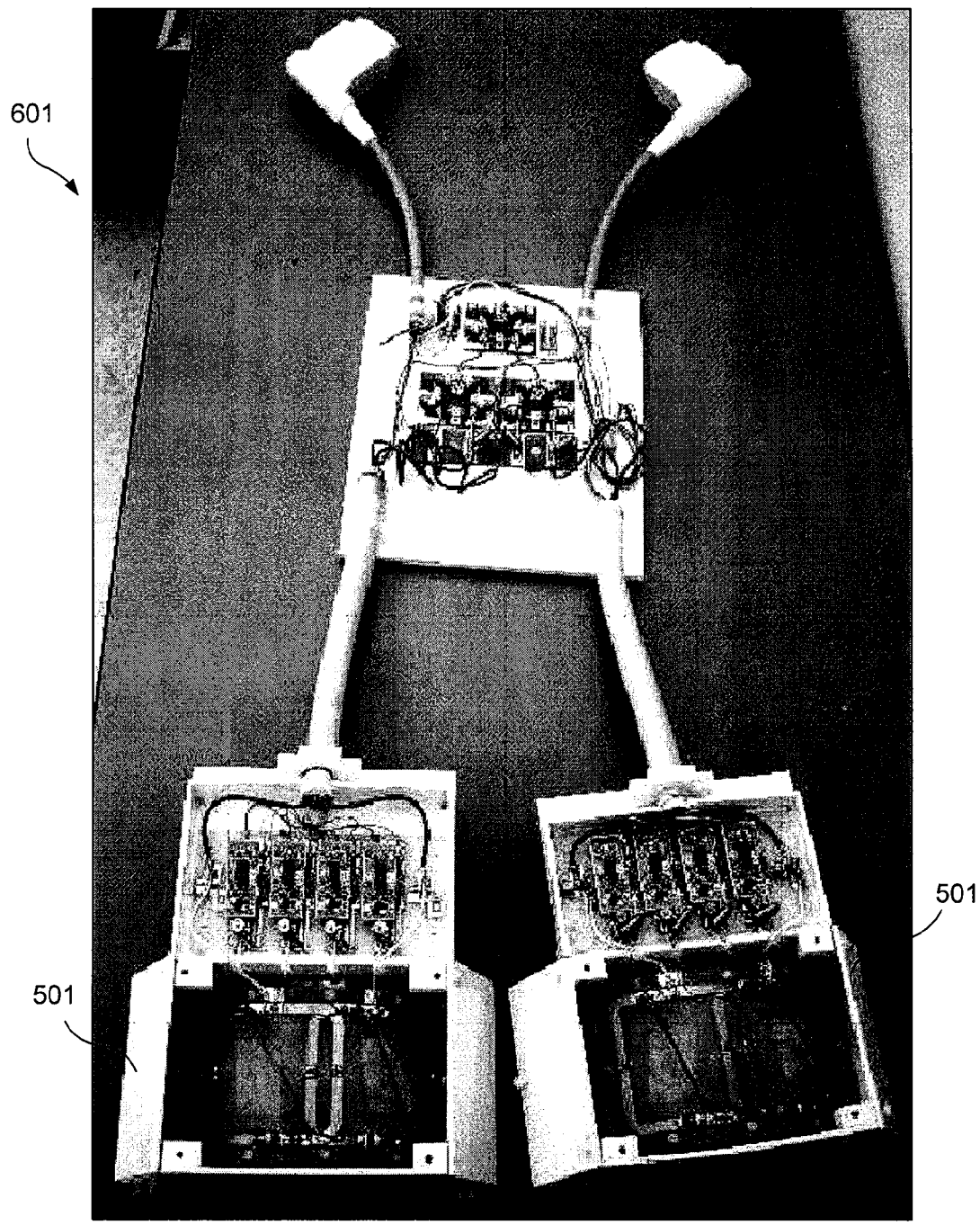
FIG. 6 is an illustration of a further exemplary embodiment of the coil arrangement/system in accordance with the present disclosure.

FIG. 6 shows an exemplary coil arrangement/system 601 according to the present disclosure. As shown in FIG. 6, two or more exemplary coil arrangements, such as the coil arrangements/systems 501, can be combined to form the coil arrangement/system 601.

FIG. 7 shows an exemplary image 701 of a human body part 702 (generated using the exemplary embodiment of the coil arrangement/system in accordance with the present disclosure), which, in this example, is an ankle. According to certain exemplary embodiments, the exemplary coil arrangement/system 601 (shown in FIG. 6) with, e.g., two or more exemplary coil arrangements 501 (shown in FIG. 5) can surround body part 702 (as shown in FIG. 7). The exemplary coil arrangement/system 601 can also be used to surround and obtain an magnetic resonance (MR) image separately from other human body parts, e.g., neck, wrist, ankle, elbow, knee, shoulder, etc., similarly to the exemplary image 701 of ankle 702, as shown in FIG. 7. Further, while the exemplary image of FIG. 7 was obtained using exemplary 7 T coil arrangements, it is possible to utilize other coil arrangements in accordance with certain exemplary embodiments of the present disclosure.

Figure 8:
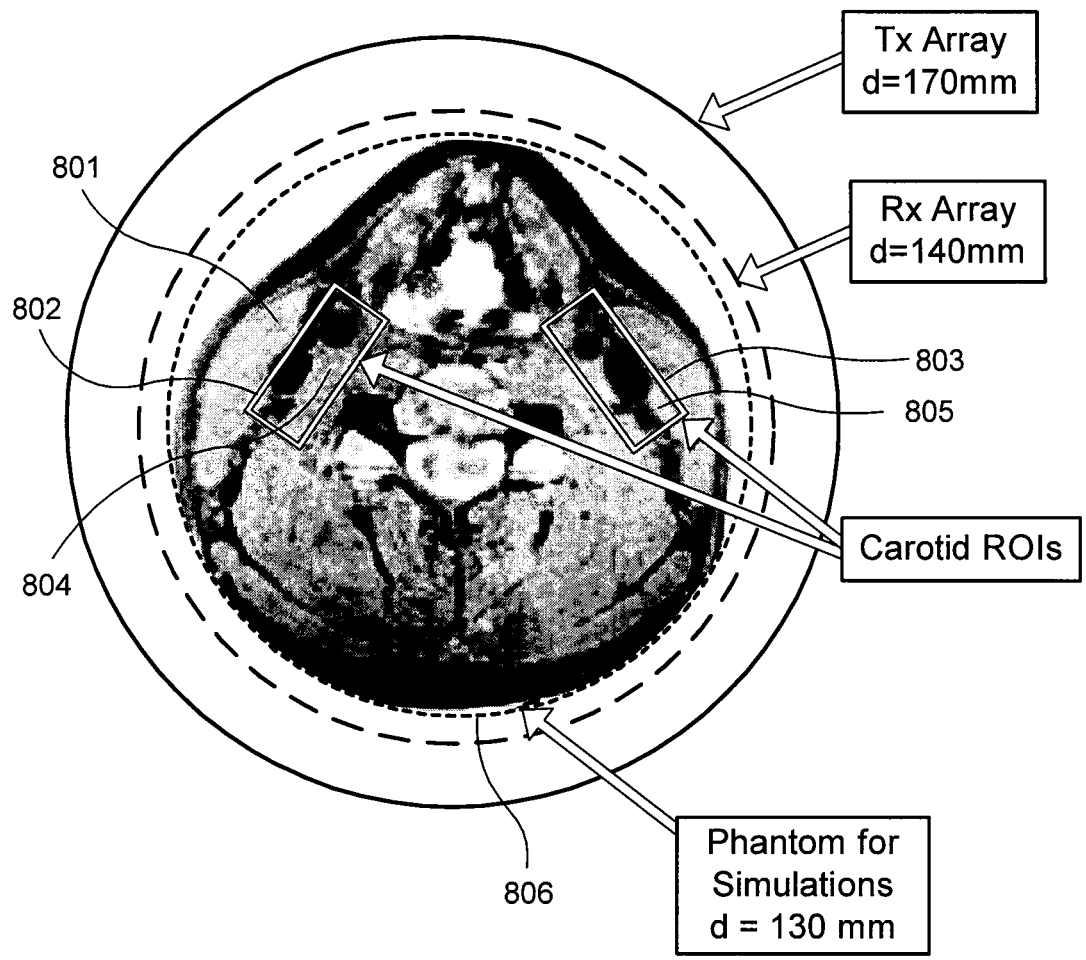
FIG. 8 is an image of an exemplary target structure together with an illustration of exemplary design parameters for an exemplary embodiment of the coil arrangement/system, in accordance with the present disclosure.

FIG. 8 shows an image of an exemplary target structure together with an illustration of exemplary design parameters for an exemplary embodiment of the coil arrangement/system according to the present disclosure, which can be, e.g., the exemplary coil arrangement/system 501 as shown in FIGS. 5 and 6. For example, rectangles 802 and 803 denote rectangular ROIs 804 and 805, respectively, and mark the average position of the carotid arteries observed in a number of subject scans. For example, as shown in FIG. 8, a cylinder of about 130 mm diameter with dielectric properties of muscle tissue at 7 T can be used to represent a neck ($\sigma$=0.7698 S/m and $\in_r$=58.24). Receive elements (e.g., 403) and transmit elements (e.g., 504, 505) can be provided on, e.g., cylinders having a 140 mm and 170 mm diameter respectively. Exemplary B1+ and B1− fields can be simulated using a current mode expansion procedure with a dyadic Greens function formulation. (See, e.g., Schnell et al., IEEE TAP; 48:418-28; and Lattanzi et al., ISMRM 2008: 1074). For example, a B1+ field of a single rectangular surface coil can be simulated, e.g., to be approximately 67 mm wide circumferentially and approximately 74 mm long.

Exemplary complex B1+ maps can be cloned, rotated and summed in complex addition to determine a transmit profile of various transmit array configurations, with e.g., available RF power that can be split substantially equally to all the elements. Exemplary receive array elements (e.g., 403) can be, e.g., approximately 40×37 mm. Exemplary SNR maps can be generated for a receive array comprising and/or consisting of, e.g., 2 sets of 4 overlapped coils, one located on each side of a phantom 806. According to certain exemplary embodiments of the present disclosure, an exemplary simulated SNR can be used, e.g., represent and/or compare to an SNR for an exemplary coil having the same diameter.

The exemplary elements of the constructed array can be machined from FR4 circuit board. The circular receive array elements can have an inner diameter of 45 mm and a track width of 5 mm. For example, such elements can be connected to Siemens 7 T preamps (Siemens Healthcare, Erlangen, Germany) by about 10 cm lengths of coax. Preamp decoupling can be implemented by transforming the input impedance of the preamp to an inductance at the coil, forming a resonance with the match capacitor. A PIN diode detuning trap can be constructed around a neighboring capacitor and bias current was supplied to it through the coax and bridged to the trap by a 0.27 nH inductor. The exemplary transmit elements can be overlapped to null mutual inductance and were each broken in two places with diodes to provide detuning during the receive phase. Pin diode detuning can be measured with a shielded decoupled probe loosely coupled to the coil by comparing the response for the coil when terminated with about 50 Ohms compared to the coil detuned.

Preamp decoupling can be similarly measured by comparing the response with the powered preamp in place or with the preamp replaced by approximately 50 Ohm load. A similar receive-only array can be provided for 3 T to facilitate a SNR comparison. B1+ maps can be generated in a phantom by stepping through RF pulse voltages in a series of GRE acquisitions. SNR maps can be generated from a GRE sequence and an identical acquisition with no RF excitation. The B1+ maps can be used to normalize the SNR by calculating the SNR that would be obtained if there was a 90 degree excitation everywhere in the sample. Such exemplary procedure can be performed to compare the 3 T and 7 T coils since the transmit excitation for the 7 T coil can be highly inhomogeneous.

Figure 9:
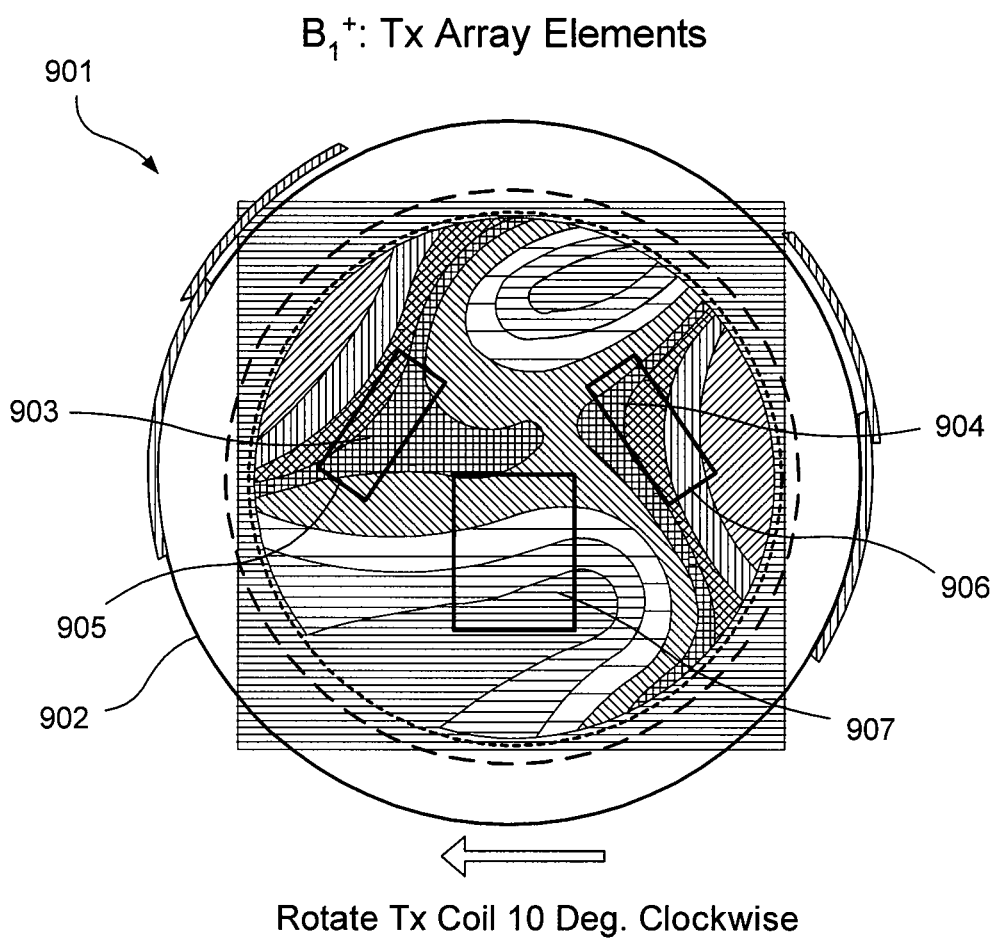
FIG. 9 is an illustration of a simulated B1+ map for an exemplary 4-element transmit array associated with the exemplary image of FIG. 8 that can be selected from a number of different exemplary transmit array configurations which can be examined in simulation, in accordance with certain exemplary embodiments of the present disclosure.

FIG. 9 shows an illustration of a simulated B1+ map 901 for an exemplary 4-element transmit array that can be chosen from a number of different exemplary transmit array configurations which can be examined in simulation according to an exemplary embodiment of the present disclosure and associated with the exemplary image of FIG. 8. For example, as provided in FIG. 9, by deliberately rotating an exemplary transmit coil 902 about 10 degrees clockwise, the carotid ROIs located within the rectangular ROIs 903 and 904, denoted by rectangles 905 and 906, respectively, can receive similar excitation to one another, as shown by the excitation patterns 907.

FIG. 10(*a*) shows an exemplary representation 1001 of an exemplary coil arrangement 1002 in accordance with certain exemplary embodiment of the present disclosure. As shown in FIG. 10(*a*), exemplary coil arrangement 102 can be provided with an 8-channel coil array 1003, which may be simulated.

FIG. 10(*b*) shows an illustration of an exemplary SNR 1012 that can correspond to the array 1003 of FIG. 10(*a*). FIG. 10(*c*) shows an illustration of an exemplary ratio 1022 of the array SNR 1012 to the Ultimate SNR. The exemplary array 1003 can achieve, e.g., up to approximately 77% of the Ultimate SNR in two ROIs. For example, by rotating the exemplary receive coils approximately 10 degrees anti-clockwise, these regions can be placed where the carotid ROIs are defined.

Figure 11C:
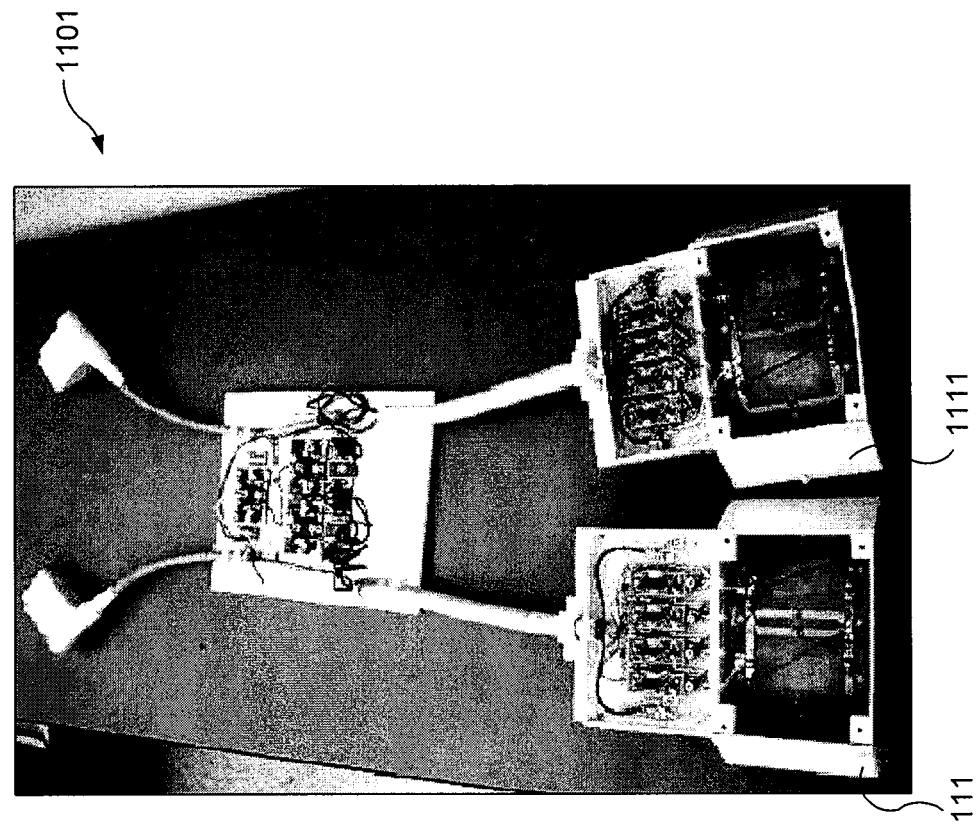
FIGS. 11($a$)-11($c$) are illustrations of various constructions of an exemplary 7 T carotid coil in accordance with certain exemplary embodiments of the present disclosure.
Figure 11A:
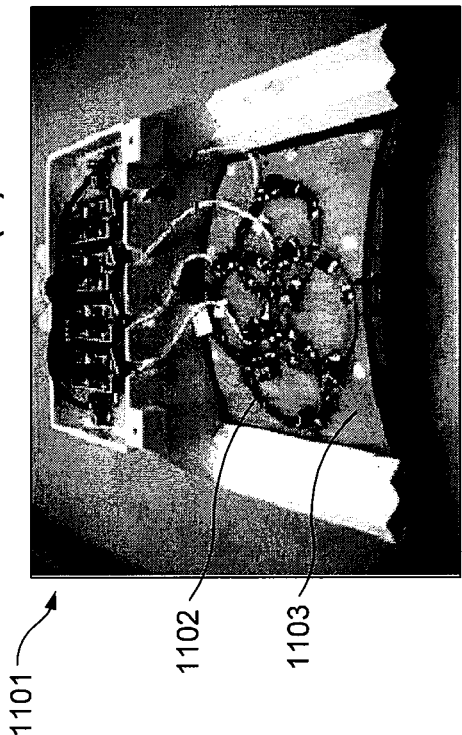
Figure 11B:
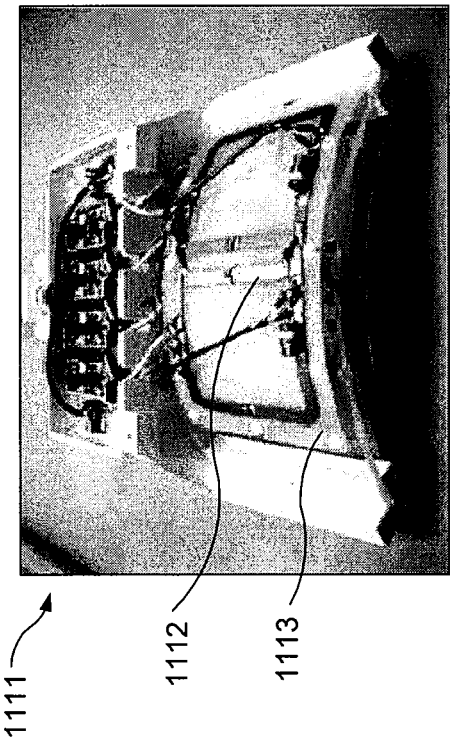

FIGS. 11(*a*)-11(*c*) show images of an exemplary construction of a 7 T carotid coil in accordance with certain exemplary embodiments of the present disclosure. For example, as shown in FIG. 11(*a*), receive coils 1102 can be mounted on a substrate 1103 which can be shifted to the left of the center of an exemplary coil arrangement/system 1101. As shown in FIG. 11(*b*), transmit coils 1112 can be mounted on another substrate 1113 and shifted to the right of the center of the exemplary coil arrangement/system 1101. In the example shown in FIGS. 11(*b*) and 11(*c*), the exemplary coil arrangement/system 1111 can include the exemplary coil arrangement 1101.

FIG. 11(*c*) shows an exemplary coil arrangement 1121 in accordance with the present disclosure which can be a 7 T carotid coil arrangement that includes, e.g., at least two coil arrangements 1111. For example, an exemplary unloaded to loaded Q ratio of the receive elements 1102 can be about and/or greater than approximately 3. In certain exemplary embodiments according to the present disclosure, it is possible for an exemplary detuning of the receive coils 1112 to be better than about −35 dB. It is also possible that an exemplary detuning of the transmit coils 1112 can be better than about −30 dB.

Figures 12A, 12B:
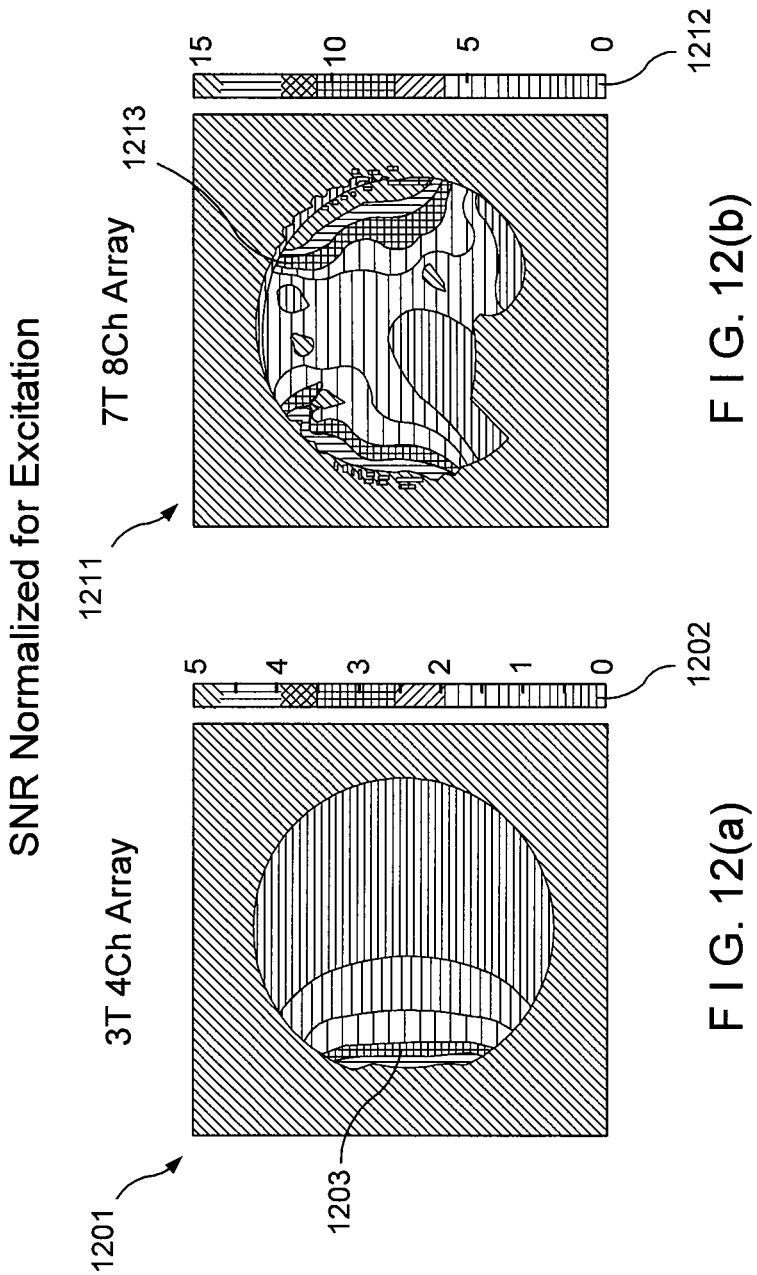
FIGS. 12($a$) and 12($b$) are images of exemplary normalized SNR maps, in accordance with certain exemplary embodiments of the present disclosure.

FIGS. 12(*a*) and 12(*b*) are illustrations of exemplary normalized SNR maps 1201, 1212, for 3 T and 7 T coil arrays, respectively. As shown in FIGS. 12(*a*) and 12(*b*) via exemplary scales 1202 and 1212, respectively (including a comparison therebetween), an exemplary SNR 1213 of a 7 T coil array can be more than about 3 times an exemplary SNR 1203 of an 3 T coil array, for example.

Exemplary full wave simulations using an exemplary procedure(s) in accordance with the present disclosure, which can be based on the dyadic Greens function approach, can facilitate an exemplary use of a range of design options before constructing an exemplary 7 Tesla coil for carotid imaging. For example, it is possible to predict the spatial distribution of exemplary transmit and receive profiles of respective coil elements, which can be taken into consideration in the configuration of an exemplary coil arrangement/system in accordance with certain exemplary embodiments of the present disclosure.

In further exemplary embodiments according to the present disclosure, $B_1^+$ and $B_1^-$ fields can be simulated using a current mode expansion with a dyadic Greens function formulation. For example, a single exemplary rectangular surface coil can be simulated, wrapped onto a 200 mm diameter cylinder, with the element 67 mm wide circumferentially and 74 mm long. A cylindrical phantom can be simulated with diameter 158 mm, σ=0.5 S/m and $\in_r$=79, corresponding to the Siemens large cylindrical phantom. Simulated $B_1^+$ and $B_1^-$-maps can be generated by calculating the respective quantities for a number of points within the phantom (e.g., 20 points radially and every 5 degrees around the center for a 20×72 matrix) and then interpolating to generating a 1×1 mm resolution map. In another example, simulated SNR maps can be generated for low flip angles (e.g., maximum excitation <10 degrees) by creating an excitation map (e.g., sine of the magnitude of $B_1^+$) and then multiplying that by the magnitude of $B_1^-$. The respective $B_1^+$ and $B_1^-$ maps can be rotated in Matlab to test the cases of different rotational offsets of separate $T_x$ and Rx coils around the cylinder.

To verify the effect of offsetting the Tx and Rx elements, two 7 Tesla RF coils can be constructed. The first exemplary coil can include a T/R surface coil of the same dimensions as the simulated coil, constructed from FR4 circuit board with a 5 mm conductor width. The second exemplary coil arrangement can include a pair of identical elements whose centers can be rotated by 50 degrees relative to the center of the cylinder. One of the two elements can be configured as a detunable transmit coil, broken with diodes in two places. The second exemplary element can be a standard receive coil configuration with a resonant detuning trap built around the match capacitor.

For the T/R surface coil, according to another example, a T/R switch preamp device can be used (e.g., Stark Contrast, Erlangen Germany), while for the two element coil, two T/R switches can be used, one each in the transmit and receive paths. The unloaded to loaded Q ratio of the T/R and Rx only elements can be, e.g., 3.5 and 2.8 respectively, and both can indicate an active detuning of better than about −30 dB. Experimentally measured B1 maps can be generated by executing a GRE sequence and stepping through a number of different RF pulse amplitudes. Information from the $B_1^+$ measurement can be used to determine the RF pulse amplitude to provide, e.g., a 10 degree flip at the point of highest $B_1^+$ near the transmit element. Exemplary SNR maps can be generated from a GRE sequence and an identical acquisition with no RF excitation.

Figure 13:
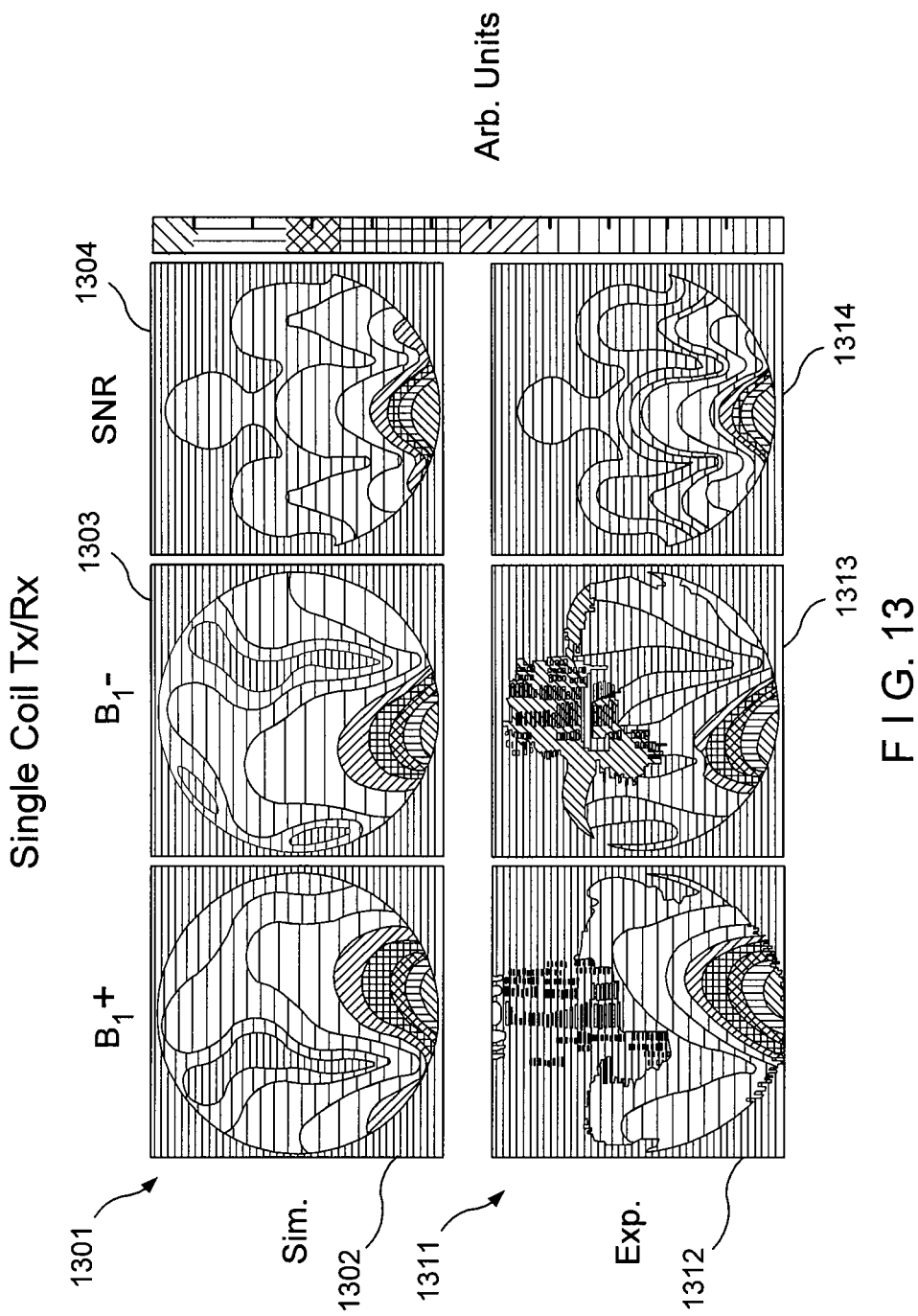
FIG. 13 is a set of images of simulations and measurement based $B_1^+$ and $B_1^-$ maps, in accordance with the exemplary embodiments of the present disclosure.

FIG. 13 shows a set of illustrations of exemplary simulations and measurements based $B_1^+$ and $B_1^-$ maps 1301, 1311, respectively, in accordance with particular exemplary embodiment of the present disclosure. The pronounced twisting of the $B_1^+$ and $B_1^-$ fields 1302, 1303 and 1312, 1313 in opposite directions, respectively, is illustrated in FIG. 13. FIG. 13 also shows that exemplary measurements obtained with a use of a T/R surface coil can closely correspond to the simulations within the limits of the B1 mapping procedure, which can break down for regions away from the coil element. In addition, FIG. 13 illustrates the exemplary simulated and experimental SNR 1304, 1314, respectively, for a low flip angle excitation. Again, the correspondence between the exemplary simulation and experiment can be close, and possibly very close.

Figure 14:
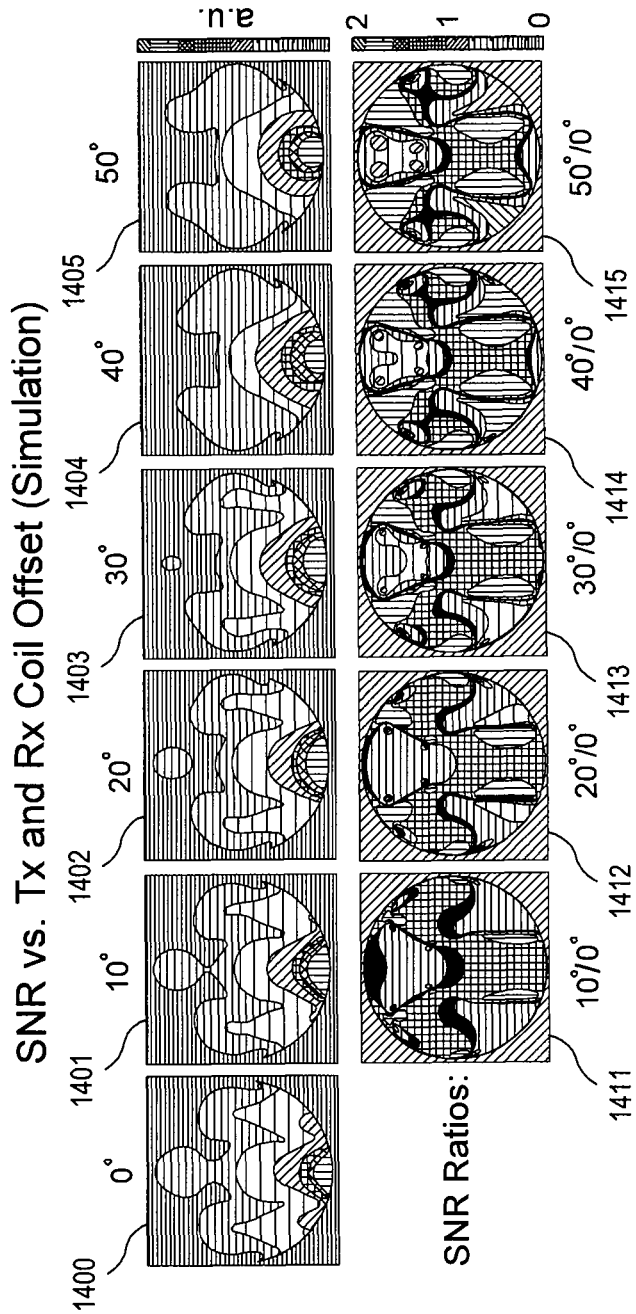
FIG. 14 is a set of exemplary maps showing the effect of separating the Tx and Rx functionalities into two elements, and rotating them relative to each other in 10 degree increments, in accordance with certain exemplary embodiments of the present disclosure.

FIG. 14 shows illustration of exemplary maps 1400, 1401, 1402, 1403, 1404, 1405 providing an effect of separating transmit (Tx) and receive (Rx) functionalities into two elements, and rotating them relative to one another in about 10 degree increments. Corresponding exemplary SNR ratios are illustrated in FIG. 14 as panels 1411, 1412, 1413, 1414, 1415, and may indicate that there can be a region of the SNR boost of up to, e.g., approximately 40%, which can move deeper into the sample as the angle is increased.

Figure 15:
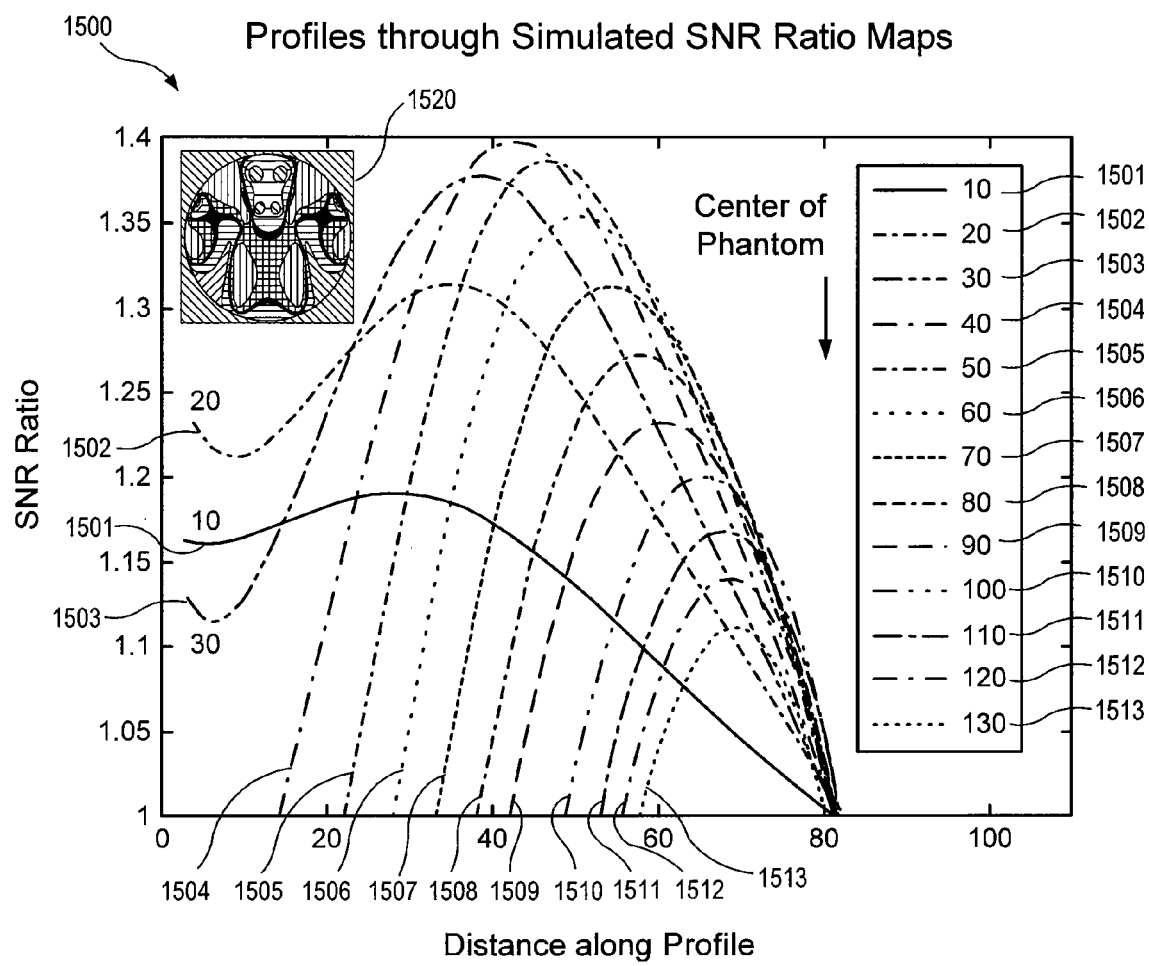
FIG. 15 is an exemplary graph which illustrates exemplary curves that can represent plots of profiles through exemplary SNR ratio maps, in accordance with certain exemplary embodiments of the present disclosure.

FIG. 15 shows an exemplary graph 1500 which illustrates exemplary curves 1501-1513 that can represent plots of profiles through exemplary SNR ratio maps (e.g., SNR ratio map 1520) in accordance with particular exemplary embodiments of the present disclosure. In particular, exemplary curves 1501-1503 show exemplary SNR boosts associated with ROIs at different depths in a phantom. For example, curve 1501 shows an exemplary SNR boost associated with an ROI located about 10 mm into the phantom, curve 1502 shows an exemplary SNR boost associated with an ROI located about 20 mm, etc. As shown in FIG. 15, for an exemplary ROI at a given depth in a phantom, there can be, e.g., an optimum offset between the transmit and receive elements. In this example, as shown by curve 1504 in FIG. 15, the exemplary maximum SNR boost can be obtained with a 40 degree offset, providing, e.g., about a 40% SNR boost at a depth of about 40 mm into the phantom.

Figure 16:
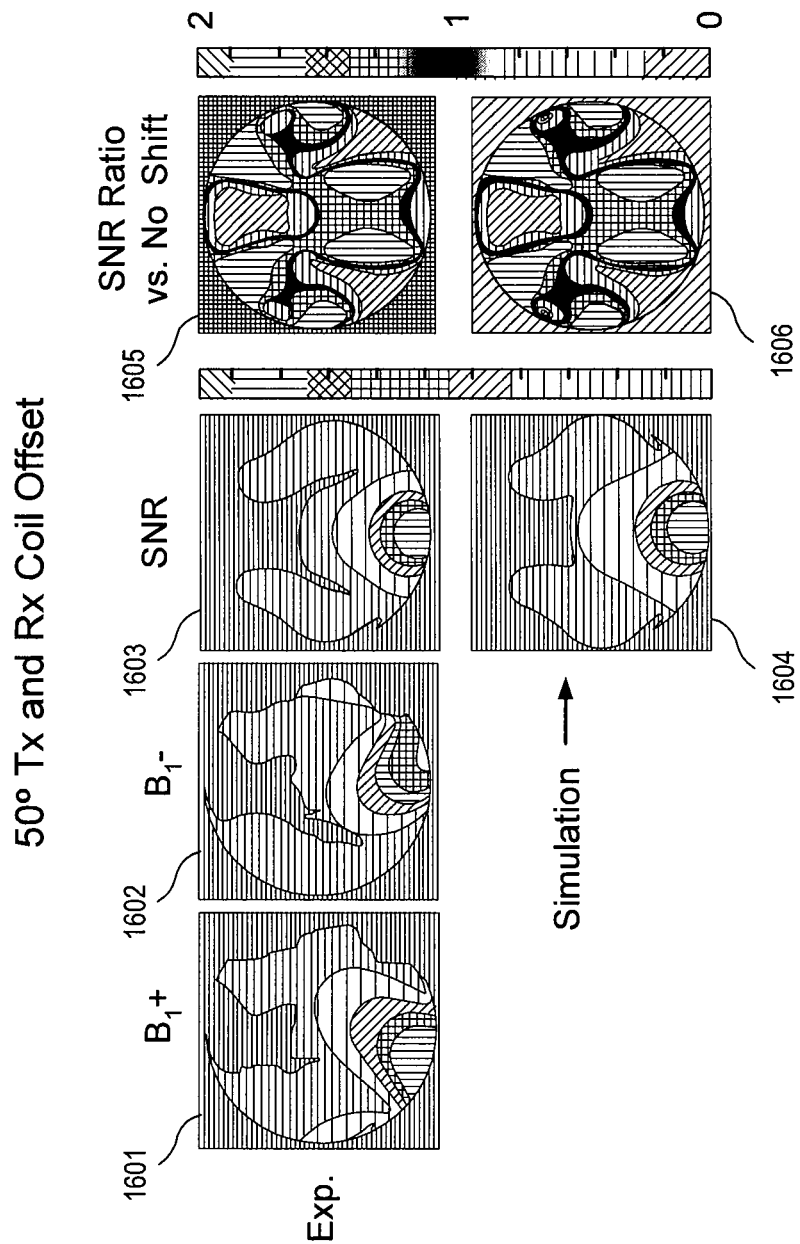
FIG. 16 is a set of exemplary maps that illustrate an exemplary verification of a benefit of offsetting Tx and Rx elements for a about a 50 degree offset, in accordance with certain exemplary embodiments of the present disclosure.

FIG. 16 shows exemplary maps 1601-1606 according to the present disclosure that illustrate an exemplary verification of a benefit of offsetting Tx and Rx elements for a about a 50 degree offset. In particular, FIG. 16 shows how offsetting the Tx and Rx elements can steer the $B_1^+$ and $B_1^-$ fields towards each other. This can have an effect of increasing the SNR at a depth, although the SNR closer to the surface can be decreased. FIG. 16 also shows that in this example as well, there can be a close correspondence between data resulting from exemplary measurements and that from exemplary simulations.

Thus, while an exemplary coil with separate Tx and Rx elements can have a greater complexity than a simple T/R surface coil, for a ROI deep in the sample, this exemplary complexity can be acceptable for the potential 40% or more SNR boost that can be achieved with certain exemplary embodiments according to the present disclosure. In particular, an exemplary coil can be useful for, e.g., imaging a cervical spine at 7 T. More generally, certain exemplary embodiments according to the present disclosure can demonstrate that the twisted $B_1^+$ 1601 and $B_1^-$ 1602 profiles can be taken into account in the design of high field RF coils in order to, e.g., maximize the performance of such exemplary coil(s). Maps 1605 and 1606 show exemplary SNR ratio maps comparing the case of shifted transmit and receive coils versus a single unshifted transmit receive loop. As can be seen by a comparison of exemplary maps 1605 to 1606, there can be a close correspondence between the exemplary results in accordance with certain exemplary embodiments of the present disclosure and the exemplary simulation.

For example, in accordance with certain exemplary embodiments of the present disclosure, $B_1^+$ and $B_1^-$ fields 1601, 1602 can be generated using a full-wave simulation based on dyadic Green's functions with a 40 cm diameter cylindrical phantom with uniform dielectric properties corresponding to muscle tissue (e.g., σ=0.79, S/m $\in_r$=59). Six different square elements can be simulated, with side lengths of, e.g., about 4, 6, 8, 10, 12, and 14 cm. In order to quantitatively optimize the design parameters, a ROI of about 9 cm depth and about 8 cm diameter corresponding to a spinal region can be chosen as the optimization target area based on human anatomy. Different designs for individual "building blocks" can be evaluated, which can be conveniently arranged next to one another along a Z-axis to increase coil coverage along the Z direction, for example. Based on simulation results as provided in portions 1604 and 1606, exemplary validation can be performed by constructing certain array designs with about 10 cm elements made from, e.g., FR4 circuit board with an approximately 6 mm conductor width, as shown in Table 1, for example.

TABLE 1

| No | Array design |
|---|---|
| 1 | 1 T/R coil |
| 2 | 2coils: 1Tx with and 1 offseted Rx |
| 3 | 2coils: 2 T/R coils with 180 driving (Kraff's system) |
| 4 | 2coils: 2 T/R coils with 90 driving |
| 5 | 3coils: 1Tx coil + 1 T/R coil + 1Rx (Our prototype) |

Each coil can be tuned to about 297.2 MHz with 8 capacitors. A body mimicking phantom with the same or similar dielectric properties as the simulated tissue can be provided. Standard detune circuits can be used for Rx coils providing at least about 30 dB detune. Diodes can be incorporated in series with the Tx coils to provide at least about 18 dB detune. For each surface coil, an exemplary a T/R switch preamp device can be used (e.g., Stark Contrast, Erlangen Germany), which also can provide at least about 17 dB preamp decoupling during receive. Exemplary MR procedures can be performed on, e.g., a Siemens Magnetom 7 T system. GRE sequences with about 1250 ms TR and various transmit voltages can be used for exemplary $B_1^+$ 1601 and $B_1^-$ 1602 mapping and exemplary SNR scans 1603 for different arrays can be calibrated with an 80 degree flip angle at 5 cm depth, for example.

Exemplary Coil Optimization.

Two different exemplary coil optimization strategies can be utilized according to certain exemplary embodiments of the present disclosure. An exemplary use of a strategy of offsetting separate Tx and Rx elements to optimize $B_1^+$ and $B_1^-$ in the ROI can involve, as an exemplary initial procedure, the optimization of the coil size and the corresponding offset between the Tx and Rx elements. An average signal strength within a ROI can be chosen as a metric.

Figure 17:
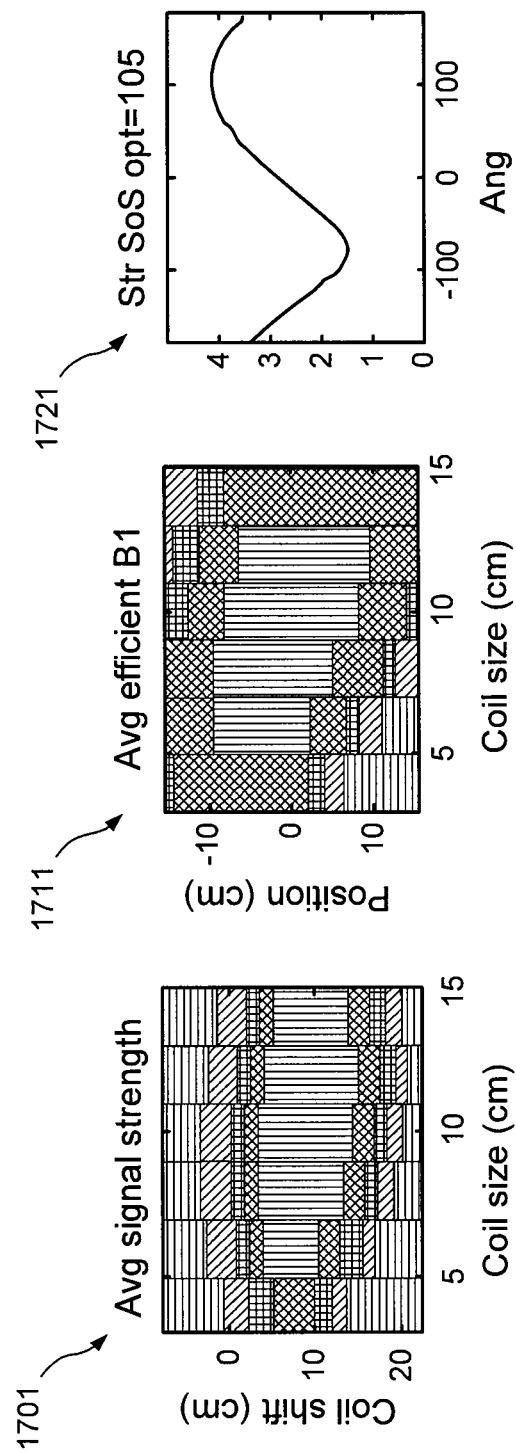
FIG. 17($a$) is an illustration of an exemplary map that show a possible optimal coil size being about 10 cm and a possible optimal offset between the centers of transmit and receive coils can be about 8.8 cm, in accordance with certain exemplary embodiments of the present disclosure.

FIG. 17(*a*) shows an exemplary map 1701 that indicates an optimal coil size can be about 10 cm and an optimal offset between the centers of two coils can be about 8.8 cm, according to certain exemplary embodiments of the present disclosure. These exemplary values can correspond to the exemplary case for two coils overlapped to minimize inductive coupling. Another exemplary strategy can be to consider the case of two exemplary transmit-receive coils placed side by side. For each element size, it is possible to vary the azimuthal position of the loop pair and then step through driving phases for the exemplary two loops until the maximum B1+ efficiency is obtained in the ROI.

FIG. 17(*b*) shows an exemplary map 1711 that indicates exemplary results where each data point can have already been optimized for a driving phase, for which it is possible to not necessarily be the same for each case. The optimum can be reached, e.g., for a pair of 10 cm elements with an offset of zero, which in exemplary coordinate definition can correspond to the right-hand coil being centered under the ROI.

FIG. 17(*c*) shows an exemplary graph 1721 according to certain exemplary embodiments of the present disclosure. For example, the optimum driving phase for this configuration can be about 105°, while it is possible to use 90° (99% of the maximum $B_1^+$ efficiency) in accordance with certain exemplary embodiments of the present disclosure. For example, by varying the phase, it is possible to create an exemplary quadrature (circularly polarized) excitation in the target region to increase efficiency in producing a B1+ field the target region.

Figure 18:
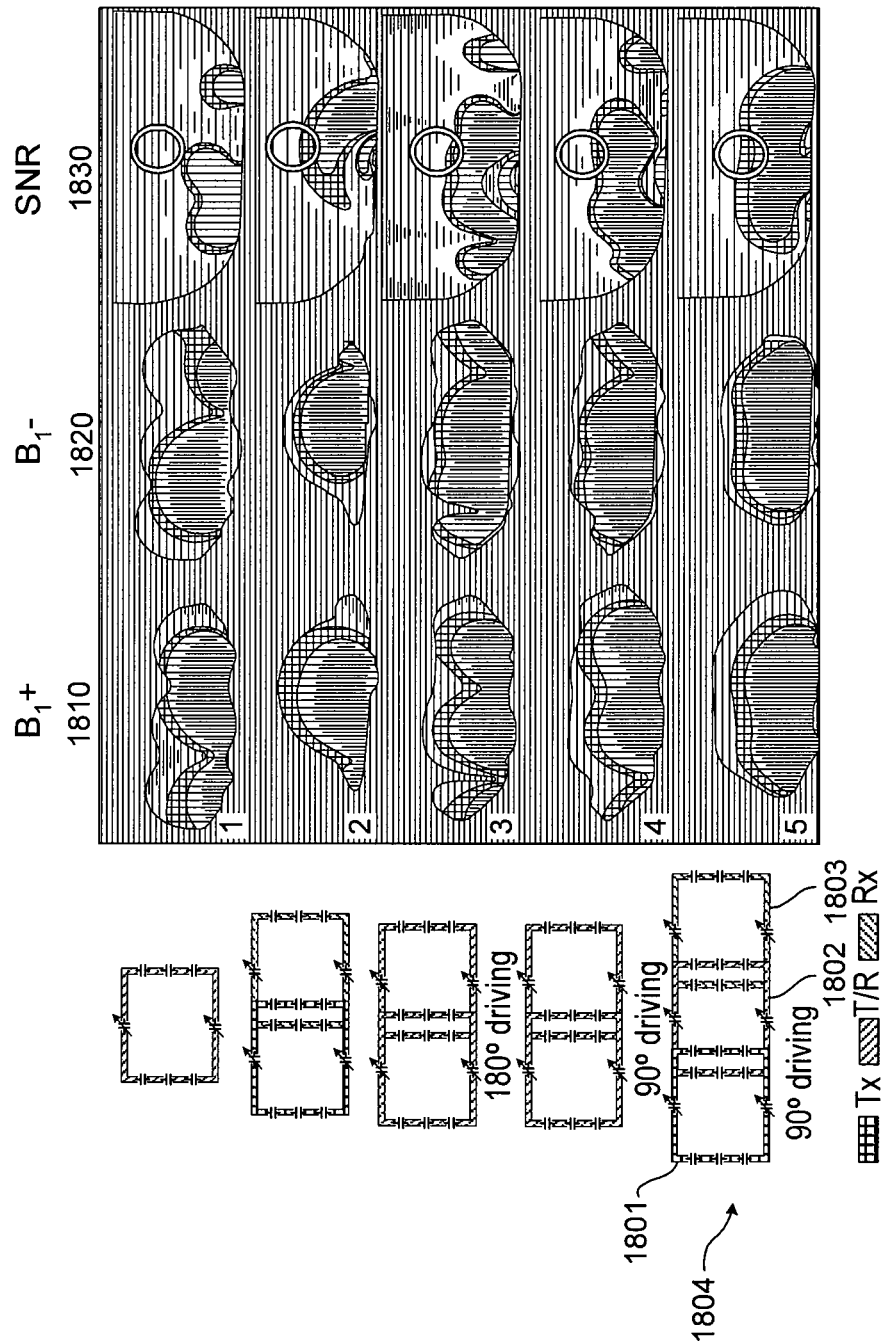
FIG. 18 is a diagram of an exemplary configuration of the coil arrangement/system in accordance with certain exemplary embodiments of the present disclosure, and illustration of three exemplary geometrically decoupled 10 cm coils associated with the exemplary configuration.

FIG. 18 shows a set of illustrations of three exemplary geometrically decoupled 10 cm coils 1801, 1802, 1803 with coil 1801 and 1802 performing a transmitting function, and coils 1802 and 1803 performing a receiving function. A center of the exemplary central coil 1802 can be aligned with the centerline of ROI. As can be seen in FIG. 18, after an exemplary optimization, a basic building block 1804 can be provided as shown in the bottom row of an exemplary configuration of FIG. 18.

When loaded, exemplary tune and matching $S_{11}$ of each coil can be <−20 dB and the isolation $S_{21}$ between two neighboring coils can be <−25 dB. The unloaded/loaded Q ratio of a single element can be about 13.4. As provided in FIG. 18, resulting $B_1^+$, $B_1^-$, and SNR maps for the various exemplary designs specified in Table 1 (provided herein above), for example, are shown within columns 1810, 1820 and 1830, respectively. The circles in the exemplary SNR maps indicate the exemplary ROIs. The windowing within each column is the same From the exemplary $B_1$ maps, it can be seen that utilizing TxRx offsetting (e.g., exemplary designs 2 and 5 of Table 1), the peaks of $B_1^+$ can coincide with the peaks of $B_1^-$, optimizing the system efficiency. Among five exemplary arrays, it is possible that a three-element exemplary embodiment can achieve the highest average SNR within the ROI as well as demonstrate the most homogeneous excitation within and near the exemplary ROI without noticeable null regions in the FOV.

Figure 19:
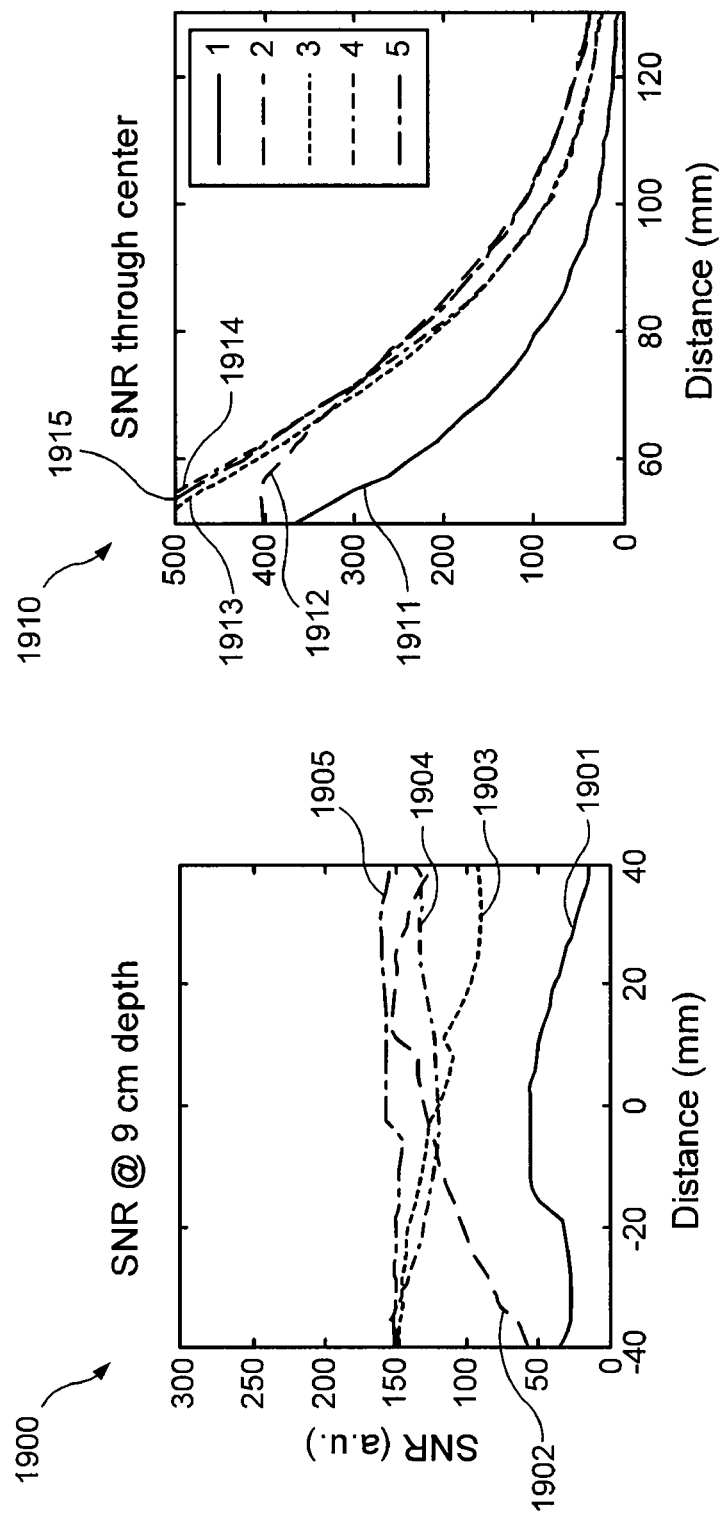
FIGS. 19($a$) and 19($b$) are exemplary graphs that illustrate exemplary SNR profiles at two directions through the center of region of interest (ROI), in accordance with certain exemplary embodiments of the present disclosure.

FIGS. 19(*a*) and 19(*b*) show exemplary graphs 1900, 1910 that illustrate exemplary SNR profiles associated with the exemplary designs specified in Table 1, represented by curves 1901-1905 and 1911-1915, at two directions through the center of ROI in accordance with the present disclosure. FIGS. 19(*a*) and 19(*b*) also illustrate the significance of optimizing on 2D ROI rather than a line or a particular point, provided that SNR of curve 2 (representing the exemplary SNR profile associated with the exemplary design 2 of Table 1) was close to curve 5 (representing the exemplary SNR profile associated with the exemplary design 5 of Table 1) at the vertical center line but performed much worse off-center along a horizontal profile. In comparing certain exemplary designs (e.g., corresponding to curves 3 and 4, which can represent the exemplary SNR profiles associated with exemplary designs 3 and 4 of Table 1), a 90° phase drive can be found to produce a higher $B_1^+$ efficiency in the ROI. This result can be in contrast to those presented by Kraff et al. (see, e.g., Kraff et al., *Invest, Radio,* 44, 11, 734-740 (2009)) who claimed greatest $B_1^+$ efficiency near the coil overlap region with the coils drive with 180° phase difference. Rather, 180° phase can provide enhanced $B_1^+$ at shallow depths, but for deeper regions driving phases closer to 90° can be superior, which can be due to more efficient excitation of a circularly polarized $B_1^+$ field, for example.

To illustrate an SAR benefit of quadrature excitation, temperature related procedures can performed on a 4 kg leg of lamb with systems represented by curves 3 and 4 (corresponding to the exemplary SNR profiles associated with exemplary designs 3 and 4 of Table 1). The highest heating in each case can be observed in the region of the coil overlap. With 90° phase drive (curve 4, representing the exemplary SNR profile associated with exemplary design 4 of Table 1) there can be 35% less peak local heating than with 180° phase (curve 3, representing the exemplary SNR profile associated with exemplary design 3 of Table 1). This can be because the 180° phase drive results in currents in phase on the coil conductors on the overlapped edges, which can result in the E-fields associated with the capacitors there to be in phase also, yielding higher peak E-fields.

Thus, by utilizing certain exemplary concepts of TxRx offsetting, quadrature excitation, and quantitative optimization, exemplary coil arrangements according to the present disclosure can improve $B_1^+$ efficiency and higher average SNR with the ROI, as well as less peak local heating, as compared with the prior coil arrangements. Even with an exemplary two coil system in accordance with the present disclosure, increased B1+ efficiency at depth and reduced SAR can be achieved when the driving phase is optimized. The coverage along the length of the spine can be easily extended by adding more similar geometrically decoupled building blocks, for example. Certain design optimization procedures in accordance with the present disclosure can also be used with other high field coil arrangements.

Figure 20:
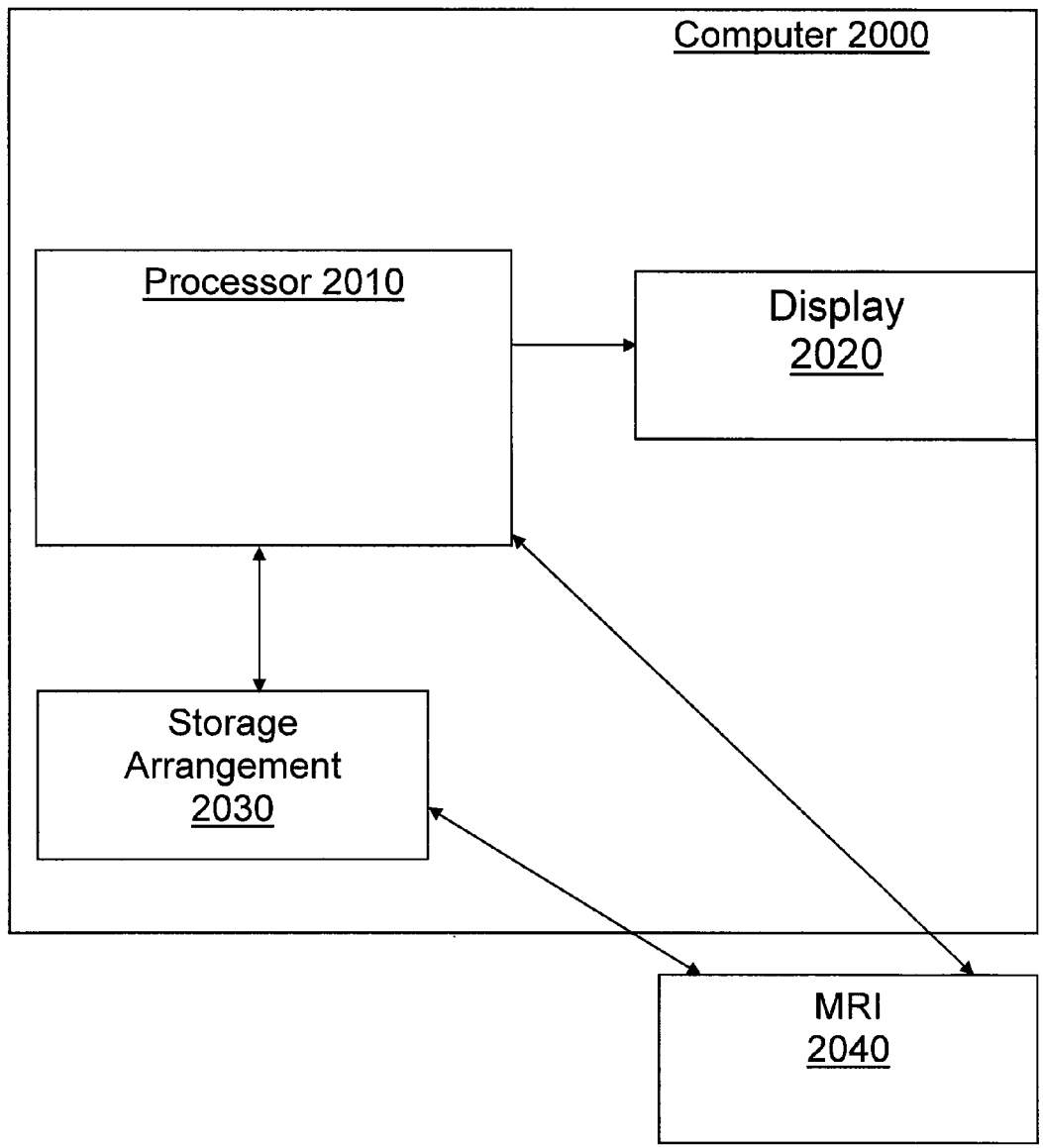
FIG. 20 is a block diagram of an exemplary embodiment of a system, in accordance with the present disclosure.

FIG. 20 illustrates a block diagram of an exemplary embodiment of a system according to the present disclosure. A computer 2000 can be provided having a processor 2010 which can be configured or programmed to perform the exemplary steps and/or procedures of the exemplary embodiments of the techniques described above. For example, an external device, such as a system which may include an MRI component 2040, can provide measurements to the processor 2010. Such data can be associated with, for example, at least one portion of an anatomical structure. Other sensors and/or external devices or arrangements can be used to provide various type of data, e.g., external processors, biological sensors, etc. According to one exemplary embodiment of the present disclosure, the data can be stored in a storage arrangement 2030 (e.g., hard drive, memory device, such as RAM, ROM, memory stick, floppy drive, etc.). The processor 2010 can access the storage arrangement 2030 to execute a computer program or a set of instructions (stored on or in the storage arrangement 2030) which perform the procedures according to the exemplary embodiments of the present disclosure.

Thus, e.g., when the processor 2010 performs such instructions and/or computer program, the processor can be configured to perform the exemplary embodiments of the procedures according to the present disclosure, as described above herein. For example, the processor can receive information from the MRI 2040 relating to the diffusivity of a sample. This information can be received directly from the MRI 2040 or accessed from the storage arrangement. The processor 2010 can then determine information relating to a permeability of a membrane and/or a measure of a total surface area of a membrane (or membranes) in a sample as a function of the received information.

A display 2020 can also be provided for or in the exemplary system of FIG. 20. The storage arrangement 2030 and the display 2020 can be provided within the computer 2000 or external from the computer 2000. The information received by the processor 2010 and the information determined by the processor 2010, as well as the information stored on the storage arrangement 2030 can be displayed on the display 2020 in a user-readable format.

The foregoing merely illustrates the principles of the present disclosure. Various modifications and alterations to the described embodiments will be apparent to those having ordinary skill in art the in view of the teachings herein. It will thus be appreciated that those having ordinary skill in art will be able to devise numerous systems, arrangements, and methods which, although not explicitly shown or described herein, embody the principles of the disclosure and are thus within the spirit and scope of the disclosure. In addition, all publications and references referred to above are incorporated herein by reference in their entireties. It should be understood that the exemplary procedures described herein can be stored on any computer accessible medium, including a hard drive, RAM, ROM, removable disks, CD-ROM, memory sticks, etc., and executed by a processing arrangement which can be a microprocessor, mini, macro, mainframe, etc. In addition, to the extent that the prior art knowledge has not been explicitly incorporated by reference herein above, it is explicitly being incorporated herein in its entirety. All publications referenced above are incorporated herein by reference in their entireties.

What is claimed is:

1. A coil arrangement, comprising:
a plurality of elements which are provided at an angle from one another, each of the elements comprising a substrate, wherein the angle is selected to effectuate an imaging of a target region of interest at least one of a predetermined depth within a structure or range of depths within the structure; and
an array of surface coil receivers situated on at least one of the substrates, the surface coil receivers being shifted relative to a center of the coil arrangement,
wherein a position of the surface coil loops is shifted relative to a center of the coil arrangement in an opposing direction from a direction at which the surface coil receivers are shifted.

2. The coil arrangement of claim 1, wherein the angle is selected to effectuate a predetermined transmit efficiency for at least one of the elements.

3. The coil arrangement of claim 1, wherein the angle is selected to effectuate a predetermined receive sensitivity for at least one of the elements.

4. The coil arrangement of claim 1, further comprising at least one arrangement which is configured or structured to at least one of manually or automatically adjust the angle.

5. The coil arrangement of claim 1, wherein the elements are situated with respect to one another so as to provide a gap therebetween.

6. The coil arrangement of claim 1, wherein the substrates are curved.

7. The coil arrangement of claim 1, wherein one the substrates is substantially positioned above another one of the substrates.

8. The coil arrangement of claim 1, wherein the surface coil receivers are situated on the substrate at a position closest to the structure.

9. The coil arrangement of claim 1, further comprising an array of surface coil loops situated on at least another one of the substrates.

10. The coil arrangement of claim 9, wherein the surface coil loops are configured to transmit a magnetic resonance signal.

11. The coil arrangement of claim 10, wherein the surface coil loops comprise a plurality of loops, and at least two of the loops overlap one another.

12. The coil arrangement of claim 9, wherein a position of the surface coil loops is shifted relative to a center of the coil arrangement.

13. The coil arrangement of claim 1, wherein at least one of (i) a position of the surface coil loops is shifted relative to a center of the coil arrangement, or (ii) a position of the surface coil receivers is shifted relative to the center of the coil arrangement, so as to compensate for a twisting of at least one of a B1+ field or a B1− field.

14. The coil arrangement of claim 13, wherein the twisting is of the B1+ field and the B1− field in opposing directions from one another.

15. The coil arrangement of claim 13, wherein a position of the surface coil receivers is shifted relative to a center the coil arrangement by a distance of approximately 37 mm.

16. The coil arrangement of claim 1, wherein a position of the surface coil receivers is shifted relative to a center of the coil arrangement by a distance of between about 30 mm and about 40 mm.

17. The coil arrangement of claim 1, wherein the elements are configured to be substantially optimized with respect to a transmit profile and a receive profile to a specific region of the structure.

18. The coil arrangement of claim 1, wherein the elements are configured for high field magnetic resonance imaging.

19. The coil arrangement of claim 18, wherein a high field is a field of at least 3 Tesla.

20. The coil arrangement of claim 1, wherein the angle is selected to be greater than zero degrees and less than or equal to 60 degrees.

21. The coil arrangement of claim 20, wherein the angle is selected to be greater than or equal to 10 degrees and less than or equal to 50 degrees.

22. The coil arrangement of claim 21, wherein the angle is selected to be about 30 degrees.

23. The coil arrangement of claim 1, further comprising at least one geometrically decoupled element so as to extend a coverage of the imaging.

24. The coil arrangement of claim 1, wherein in the elements are configured to provide a phase between the elements so as to facilitate at least one of a quadrature or circularly polarized excitation in a region of interest.

25. The coil arrangement of claim 1, wherein the elements are configured to provide a phase between the elements so as to facilitate at least one of (i) compensate for the twisting of B1+ fields, or (ii) achieve a substantially maximum B1+ efficiency.

26. The coil arrangement of claim 1, wherein the elements are configured to provide a phase between the elements, and wherein the phase is capable of being controlled dynamically.

27. The coil arrangement of claim 26, wherein the phase is capable of being controlled dynamically so as to adjust a depth of the region of interest in a sample.

28. The coil arrangement of claim 1, wherein the elements are configured to provide for an overlap of at least two coils so as to reduce an inductive coupling to be below a predetermined threshold.

* * * * *